United States Patent
Kashiyama et al.

(10) Patent No.: US 10,056,270 B2
(45) Date of Patent: Aug. 21, 2018

(54) SUBSTRATE TREATING APPARATUS AND SUBSTRATE TREATING METHOD

(71) Applicant: SCREEN Holdings Co., Ltd., Kyoto (JP)

(72) Inventors: Masahito Kashiyama, Kyoto (JP); Koji Nishiyama, Kyoto (JP); Kota Kabune, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/070,588

(22) Filed: Mar. 15, 2016

(65) Prior Publication Data
US 2016/0271655 A1 Sep. 22, 2016

(30) Foreign Application Priority Data
Mar. 18, 2015 (JP) .................. 2015-054655

(51) Int. Cl.
*H01L 21/304* (2006.01)
*H01L 21/67* (2006.01)
*B08B 3/02* (2006.01)

(52) U.S. Cl.
CPC .......... *H01L 21/67051* (2013.01); *B08B 3/02* (2013.01); *H01L 21/6715* (2013.01); *B08B 2203/0264* (2013.01)

(58) Field of Classification Search
None
See application file for complete search history.

(56) References Cited

U.S. PATENT DOCUMENTS 8,539,906 B2 * 9/2013 Ogata ............... H01L 21/67051
118/319
2001/0010103 A1 8/2001 Konishi et al. .................. 15/77
(Continued)

FOREIGN PATENT DOCUMENTS

JP 2009-239081 A 10/2009
JP 2014-075575 4/2014
(Continued)

OTHER PUBLICATIONS

Office Action and Search Report dated Apr. 19, 2017 for corresponding Taiwan Patent Application No. 105108464.
(Continued)

*Primary Examiner* — Michael Barr
*Assistant Examiner* — Jason Riggleman
(74) *Attorney, Agent, or Firm* — Ostrolenk Faber LLP

(57) ABSTRACT

Disclosed is a substrate treating apparatus including a substrate holder, a rotating drive unit, a treatment liquid supplying unit, an exterior cup, and an interior cup. The interior cup is movable between a collection position where the interior cup collects the treatment liquid and a retracting position where the exterior cup collects the treatment liquid, and includes an interior cup main body with an annular contour, a liquid outlet in the interior cup main body for draining the treatment liquid in the interior cup main body, and an exhaust port in the interior cup main body for exhausting gas in the interior cup main body. The exterior cup includes an exterior cup main body with an annular contour, a liquid outlet in the exterior cup main body for draining the treatment liquid in the exterior cup main body, and an exhaust port in the exterior cup main body for exhausting gas in the exterior cup main body.

20 Claims, 11 Drawing Sheets

(56) References Cited

U.S. PATENT DOCUMENTS

| | | | |
|---|---|---|---|
| 2003/0034506 A1 | 2/2003 | Pandya et al. | 257/201 |
| 2008/0142051 A1 | 6/2008 | Hashizume | 134/23 |
| 2013/0118533 A1 | 5/2013 | Takiguchi et al. | 134/26 |
| 2014/0071411 A1 | 3/2014 | Takiguchi et al. | 355/27 |
| 2015/0072536 A1 | 3/2015 | Muramatsu et al. | 438/781 |

FOREIGN PATENT DOCUMENTS

| | | |
|---|---|---|
| TW | 200910494 A | 3/2009 |
| TW | 201233453 A1 | 8/2012 |
| TW | 201403664 A | 1/2014 |

OTHER PUBLICATIONS

Office Action dated Jun. 19, 2017 issued in corresponding Korean Patent Application No. 10-2016-0032124.

\* cited by examiner

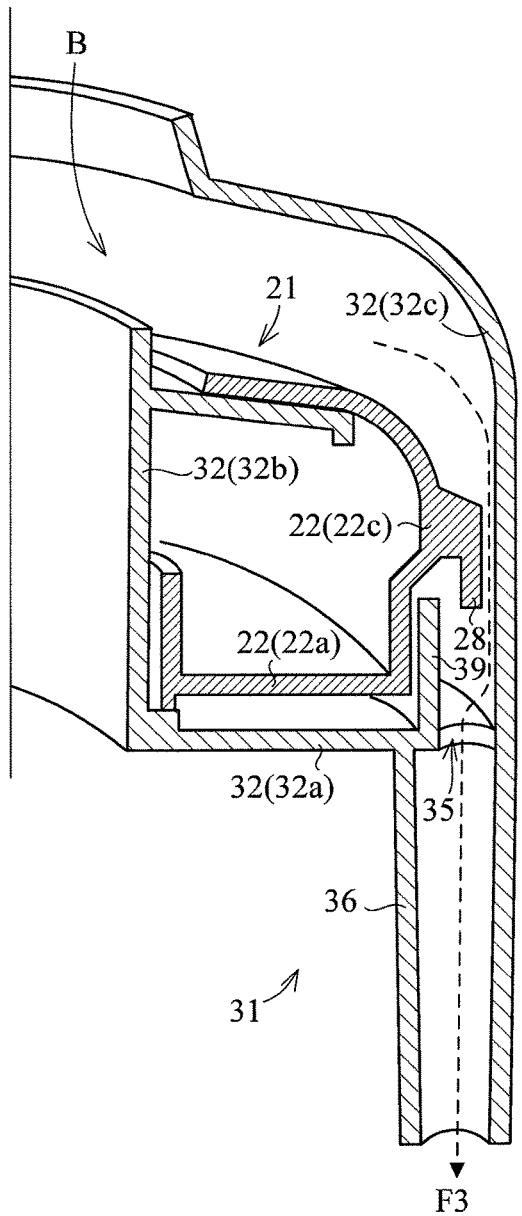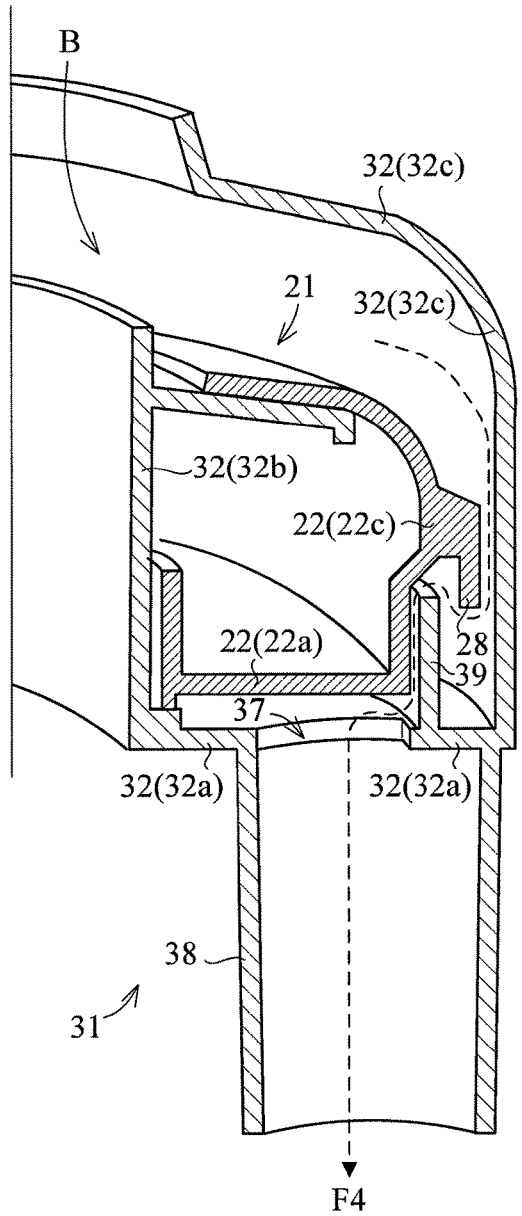

SUBSTRATE TREATING APPARATUS AND SUBSTRATE TREATING METHOD

CROSS-REFERENCE TO RELATED APPLICATIONS

This application claims priority to Japanese Patent Application No. 2015-054655 filed Mar. 18, 2015, the disclosure of which is hereby incorporated herein by reference in its entirety for all purposes.

BACKGROUND OF THE INVENTION

1. Field of the Invention

The present invention relates to a substrate treating apparatus and a substrate treating method for supplying a treatment liquid to a semiconductor substrate, a glass substrate for liquid crystal display, a glass substrate for photomask, an optical disk substrate, and the like (hereinafter, simply referred to as a "substrate"). More particularly, the present invention is directed to a technique of a cup for collecting the treatment liquid.

2. Description of the Related Art

Japanese Unexamined Patent Publication 2014-75575A discloses a substrate treating apparatus. The substrate treating apparatus includes a substrate holder, a rotary drive mechanism, first and second nozzles, a cup body, first and second drain ducts, an exhaust duct, and a movable cup. The substrate holder holds the substrate horizontally. The rotary drive mechanism rotates the substrate holder. The first nozzle supplies developer for positive tone development. The second nozzle supplies developer for negative tone development. The cup body collects the developer. The first and second drain ducts and the exhaust duct are each connected to the cup body. The movable cup moves upward and downward, thereby guiding the developer to either the first drain duct or the second drain duct.

For instance, when the first nozzle supplies developer, the movable cup guides the developer to the first drain duct. When the second nozzle supplies developer, the movable cup guides the developer to the second drain duct. The first drain duct drains the developer for positive tone development, whereas the second drain duct drains the developer for negative tone development. At this time, the exhaust duct exhausts gas within the cup body (in this case, the gas with mist in the developer). Accordingly, this prevents the developer for positive tone development and the developer for negative tone development to be mixed in the first and second drain ducts. The exhaust ducts each exhaust the gas within the cup body (containing the mist in the developer) when the first and second nozzles supply the developer, respectively.

However, the example of the conventional apparatus with such a configuration has the following drawback. That is, the exhaust duct exhausts both the mist of the developer for positive tone development and the mist of the developer for negative tone development. Consequently, the different types of mist of the developer may be mixed in the exhaust duct. When the different types of mist of the developer are mixed, this may cause difficulty in keeping a clean atmosphere within the cup, and thus also may cause difficulty in high-quality substrate treatment.

SUMMARY OF THE INVENTION

The present invention has been made regarding the state of the art noted above, and its one object is to provide a substrate treating apparatus and a substrate treating method that allow substrate treatment with high quality.

The present invention is constituted as stated below to achieve the above object. A first aspect of the present invention provides a substrate treating apparatus that performs treatment to a substrate. The substrate treating apparatus includes a substrate holder that holds the substrate in a substantially horizontal attitude; a rotating drive unit that rotates the substrate holder around a substantially vertical axis; a treatment liquid supplying unit that supplies a treatment liquid to the substrate held on the substrate holder; an exterior cup that surrounds the substrate holder laterally; and an interior cup accommodated in the exterior cup. The interior cup is movable between a collection position in which the interior cup collects the treatment liquid and a retracting position in which the exterior cup collects the treatment liquid. The interior cup includes an interior cup main body with an annular contour; a liquid outlet formed in the interior cup main body for draining the treatment liquid in the interior cup main body; and an exhaust port formed in the interior cup main body for exhausting gas in the interior cup main body. The exterior cup includes an exterior cup main body with an annular contour; a liquid outlet formed in the exterior cup main body for draining the treatment liquid in the exterior cup main body; and an exhaust port formed in the exterior cup main body for exhausting gas in the exterior cup main body.

With the substrate treating apparatus according to the first aspect of the present invention, the treatment liquid in the interior cup main body, the gas in the interior cup main body, the treatment liquid in the exterior cup main body, and the gas in the exterior cup main body are discharged individually. Accordingly, for instance, the gas in the interior cup main body is not mixed with the gas in the exterior cup main body. As a result, high-quality treatment is performable to the substrate with any of the interior cup and the exterior cup.

It is preferred in the first aspect of the present invention that the interior cup includes a cover that covers an upper side of the exhaust port of the interior cup. This allows suitable prevention of the treatment liquid from flowing into the exhaust port of the interior cup.

It is preferred in the first aspect of the present invention that the exhaust port of the interior cup is disposed higher in level than the liquid outlet of the interior cup. This allows suitable prevention of the treatment liquid from flowing into the exhaust port of the interior cup.

It is preferred in the first aspect of the present invention that the interior cup main body covers an upper side of the exhaust port of the exterior cup. This suitably prevents the treatment liquid from flowing into the exhaust port of the exterior cup.

It is preferred in the first aspect of the present invention that the exterior cup includes a partition wall that partitions the liquid outlet of the exterior cup and the exhaust port of the exterior cup. This suitably prevents the treatment liquid from flowing into the exhaust port of the exterior cup.

It is preferred in the first aspect of the present invention that the interior cup includes a collar that is connected to the interior cup main body. The exhaust port of the exterior cup is disposed inwardly from the partition wall, and the liquid outlet of the exterior cup is disposed outwardly from the partition wall. When the interior cup is disposed in the retracting position, the collar guides the treatment liquid outwardly from the partition wall. Such is preferred. This suitably prevents the treatment liquid from flowing into the exhaust port of the exterior cup.

The following is preferred in the aspect of the present invention. That is, the interior cup includes a drain tube that is connected to the interior cup main body for passing the treatment liquid drained from the liquid outlet of the interior cup, and an exhaust tube that is connected to the interior cup main body for passing the gas exhausted from the exhaust port of the interior cup main body. The exterior cup includes an extension drain tube that is connected to the exterior cup main body for accommodating the drain tube of the interior cup such that the drain tube is movable vertically, and for passing the treatment liquid drained from the drain tube of the interior cup, and an extension exhaust tube that is connected to the exterior cup main body for accommodating the exhaust tube of the interior cup such that the exhaust tube is movable vertically, and for passing the gas exhausted from the exhaust tube of the interior cup. The drain tube of the interior cup is in fluid communication with the extension drain tube, achieving reduction in length of the drain tube of the interior cup. Moreover, the exhaust tube of the interior cup is in fluid communication with the extension exhaust tube, achieving reduction in length of the exhaust tube of the interior cup. As a result, this obtains reduction in size of the interior cup.

In is preferred in the first aspect of the present invention that a part of the drain tube of the interior cup inserted into the extension drain tube has a length of 80 mm or less when the interior cup is in the collection position. This obtains more reduction in size of the interior cup.

It is preferred in the first aspect of the present invention that a part of the exhaust tube of the interior cup inserted into the extension exhaust tube has a length of 80 mm or less when the interior cup is in the collection position. This obtains more reduction in size of the interior cup.

It is preferred in the first aspect of the present invention that the substrate treating apparatus further includes a cleaning liquid supplying unit that supplies cleaning liquids for cleaning the interior cup and the exterior cup, and a spray disk that is rotatable and sprays the cleaning liquids supplied from the cleaning liquid supplying unit to the interior cup and the exterior cup. The cleaning liquid supplying unit includes a first nozzle that dispenses a first cleaning liquid of the cleaning liquids to the spray disk, and a second nozzle that dispenses a second cleaning liquid of the cleaning liquids, different from the first cleaning liquid from the first nozzle, to the spray disk. Here, the cleaning liquid supplying unit includes the first and second nozzles that dispense different cleaning liquids. Consequently, suitable cleaning liquids can be sprayed to the interior cup and the exterior cup respectively.

Moreover, a second aspect of the present invention provides a substrate treating method for performing treatment to a substrate. The substrate treating method includes a positive tone developing step of performing positive tone development with developer for positive tone development; and a negative tone developing step of performing negative tone development with developer for negative tone development. The positive tone developing step includes collecting the developer for positive tone development with a first cup, and the negative tone developing step includes collecting the developer for negative tone development with a second cup. The substrate treating method further includes a first pre-spraying step of spraying in advance a cleaning liquid for negative tone development to the second cup when the positive tone developing step is switched to the negative tone developing step, and a second pre-spraying step of spraying in advance a cleaning liquid for positive tone development to the first cup when the negative tone developing step is switched to the positive tone developing step.

The substrate treating method according to the second aspect of the present invention includes the first pre-spraying step of spraying in advance the cleaning liquid for negative tone development to the second cup. Accordingly, an environment suitable for the negative tone development is effectively formable prior to the negative tone development. Consequently, the first negative tone development previously after switching is performable with high quality.

Moreover, the substrate treating method according to the second aspect of the present invention includes the second pre-spraying step of spraying in advance the cleaning liquid for positive tone development to the first cup. Accordingly, an environment suitable for the positive tone development is effectively formable prior to the positive tone development. Consequently, the first positive tone development after switching is performable with high quality.

Here, the "first pre-spraying step" is performed subsequent to the last "positive tone developing step" prior to the "negative tone developing step" performed firstly after the switching. Moreover, the "second pre-spraying step" is performed subsequent to the last "negative tone developing step" prior to the "first positive tone developing step" performed firstly after the switching.

It is preferred in the second aspect of the present invention that the substrate treating method further includes a spraying step of spraying the cleaning liquid for positive tone development to the second cup when the negative tone developing step is switched to the positive tone developing step. This ensures to form an environment suitable for the positive tone development prior to the positive tone developing step.

The following is preferred in the second aspect of the present invention. That is, both the first and second cups are disposed in one substrate treating unit. Moreover, the positive tone developing step, the negative tone developing step, the first pre-spraying step and the second pre-spraying step are preferably performed in the one substrate treating unit. The substrate treating unit includes the first cup and the second cup. Consequently, both the positive tone development and the negative tone development are performable in the same substrate treating unit. This allows efficient performance of the positive tone development and the negative tone development with high quality.

A third aspect of the present invention provides a substrate treating method for performing treatment to substrates with a plurality of substrate treating units individually in the same space. The substrate treating method includes a positive tone developing step of performing positive tone development with developer for positive tone development in at least any of the substrate treating units; and a negative tone developing step of performing negative tone development with developer for negative tone development in at least any of the substrate treating units. The positive tone developing step includes collecting the developer for positive tone development in first cups provided in the substrate treating units individually. The negative tone developing step includes collecting the developer for negative tone development in second cups provided in the substrate treating units individually. The substrate treating method further includes a first pre-spraying step of spraying in advance a cleaning liquid for negative tone development to each of the second cups when the positive tone developing step is switched to the negative tone developing step, and a second pre-spraying step of spraying in advance a cleaning liquid for positive tone development to each of the first cups when the negative tone developing step is switched to the positive tone developing step.

The substrate treating method according to the third aspect of the present invention includes the first pre-spray step of spraying in advance the cleaning liquid for negative tone development to each of the second cups. Accordingly, an environment suitable for the negative tone development is effectively formable prior to the negative tone development. Consequently, the negative tone development is performable with high quality from the beginning in any of the substrate treating units.

Moreover, the substrate treating method according to the third aspect of the present invention includes the second pre-spray step of spraying in advance the cleaning liquid for positive tone development to each of the first cups. Accordingly, an environment suitable for the positive tone development is effectively formable prior to the positive tone developing step. Consequently, the positive tone development is performable with high quality from the beginning in any of the substrate treating units.

It is preferred that the substrate treating method according to the third aspect of the present invention further includes a spraying step of spraying the cleaning liquid for positive tone development to each of the second cups when the negative tone developing step is switched to the positive tone developing step. This ensures to form an environment suitable for the positive tone development prior to the positive tone developing step.

The present specification also discloses a substrate treating method according to the following aspect.

Supplement 1. Provided is a substrate treating method of performing treatment to a substrate. The substrate treating method includes a positive tone developing step; a negative tone developing step; a solvent atmosphere pre-forming step of pre-forming a solvent atmosphere when the positive tone developing step is switched to the negative tone developing step; and a non-solvent atmosphere pre-forming step of pre-forming a non-solvent atmosphere when the negative tone developing step is switched to the positive tone developing step.

The substrate treating method according to Supplement 1 of the present invention includes the solvent atmosphere pre-forming step. Accordingly, the environment suitable for the negative tone development is formable before the negative tone developing step. Consequently, the first negative tone development previously after the switching is performable with high quality.

Moreover, the substrate treating method in Supplement 1 of the present invention includes the non-solvent atmosphere pre-forming step. Accordingly, the environment suitable for the positive tone development is formable prior to the positive tone developing step. Consequently, the first positive tone development previously after the switching is performable with high quality.

Supplement 2. In the substrate treating method according to Supplement 1, the positive tone developing step, the negative tone developing step, the solvent atmosphere pre-forming step, and the non-solvent atmosphere pre-forming step are performed in one substrate treating unit.

With the substrate treating method of Supplement 2, both the positive tone developing step and the negative tone developing step are performable suitably in the same substrate treating unit. This allows efficient performance of the positive tone development and the negative tone development with high quality.

Supplement 3. In the substrate treating method of Supplement 2, the positive tone developing step includes collecting the treatment liquid used in the positive tone development with a first cup in the substrate treating unit, the negative tone developing step includes collecting the treatment liquid used in the negative tone development with a second cup in the substrate treating unit, the solvent atmosphere pre-forming step includes forming a solvent atmosphere in the second cup, and the non-solvent atmosphere pre-forming step includes forming a non-solvent atmosphere in at least the first cup.

The substrate treating method of Supplement 3 includes the solvent atmosphere pre-forming step. Accordingly, this allows formation of an environment suitable for the negative tone development around the substrate. Moreover, the substrate treating method of Supplement 3 includes the non-solvent atmosphere step. Accordingly, this allows formation of an environment suitable for the positive tone development around the substrate.

Supplement 4. In the substrate treating method of Supplement 3, the non-solvent atmosphere pre-forming step further includes forming a non-solvent atmosphere in the second cup.

The substrate treating method of Supplement 4 allows more appropriate formation of an environment suitable for the positive tone development around the substrate.

Supplement 5. A substrate treating method for performing treatment to a substrate in each of a plurality of substrate treating units in the same space, the substrate treating method includes a positive tone developing step of performing positive tone development in at least any of the substrate treating units; a negative tone developing step of performing negative tone development in at least any of the substrate treating units; a solvent atmosphere pre-forming step of pre-forming a solvent atmosphere when the positive tone developing step is switched to the negative tone developing step; and a non-solvent atmosphere pre-forming step of pre-forming a non-solvent atmosphere when the negative tone developing step is switched to the positive tone developing step.

The substrate treating method of Supplement 5 includes the solvent atmosphere pre-forming step. Accordingly, this allows formation of an environment suitable for the negative tone development in each of the substrate treating units prior to the negative tone developing step. Consequently, the negative tone development is performable with high quality from the beginning in any of the substrate treating units.

Moreover, the substrate treating method of Supplement 5 includes the non-solvent atmosphere pre-forming step. Accordingly, this allows formation of an environment suitable for the positive tone development in each of the substrate treating units prior to the positive tone developing step. Consequently, the positive tone development is performable with high quality from the beginning in any of the substrate treating units.

Supplement 6. In the substrate treating method of Supplement 5, the positive tone developing step includes collecting the treatment liquid used in the positive tone development with first cups in the substrate treating units, the negative tone developing step includes collecting the treatment liquid used in the negative tone development with second cups in the substrate treating units, the solvent atmosphere pre-forming step includes forming a solvent atmosphere in each of the second cups, and the non-solvent atmosphere pre-forming step includes forming a non-solvent atmosphere in each of the first cups.

The substrate treating method of Supplement 6 includes the solvent atmosphere pre-forming step. Accordingly, this allows formation of an environment suitable for the negative tone development around the substrate. Moreover, the substrate treating method of Supplement 6 includes the non-solvent atmosphere step. Accordingly, this allows formation of an environment suitable for the positive tone development around the substrate.

Supplement 7. In the substrate treating method of Supplement 6, the non-solvent atmosphere pre-forming step further includes forming a non-solvent atmosphere in each of the second cups.

The substrate treating method of Supplement 7 allows more appropriate formation of an environment suitable for the positive tone development around the substrate.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 8A and 8B each illustrate a cup in detail.

DESCRIPTION OF THE PREFERRED EMBODIMENTS

Figure 1:
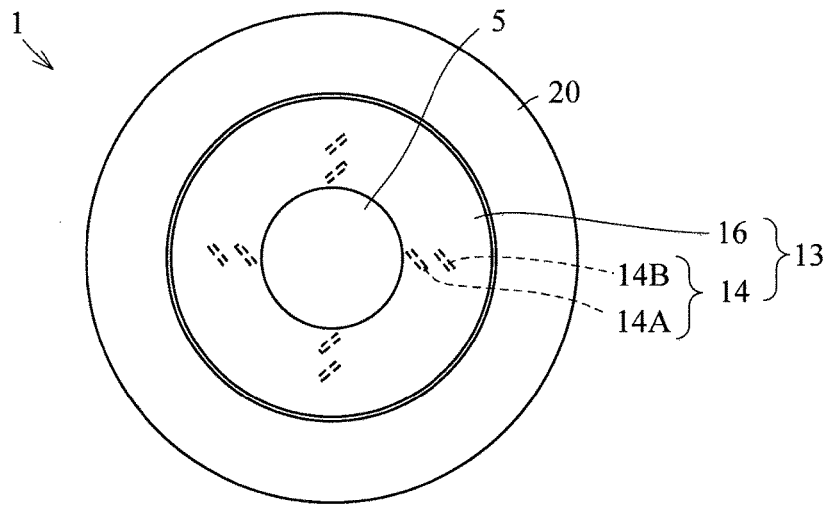
FIG. 1 is a plan view of a substrate treating apparatus according to Preferred Embodiment 1.
Figure 2:
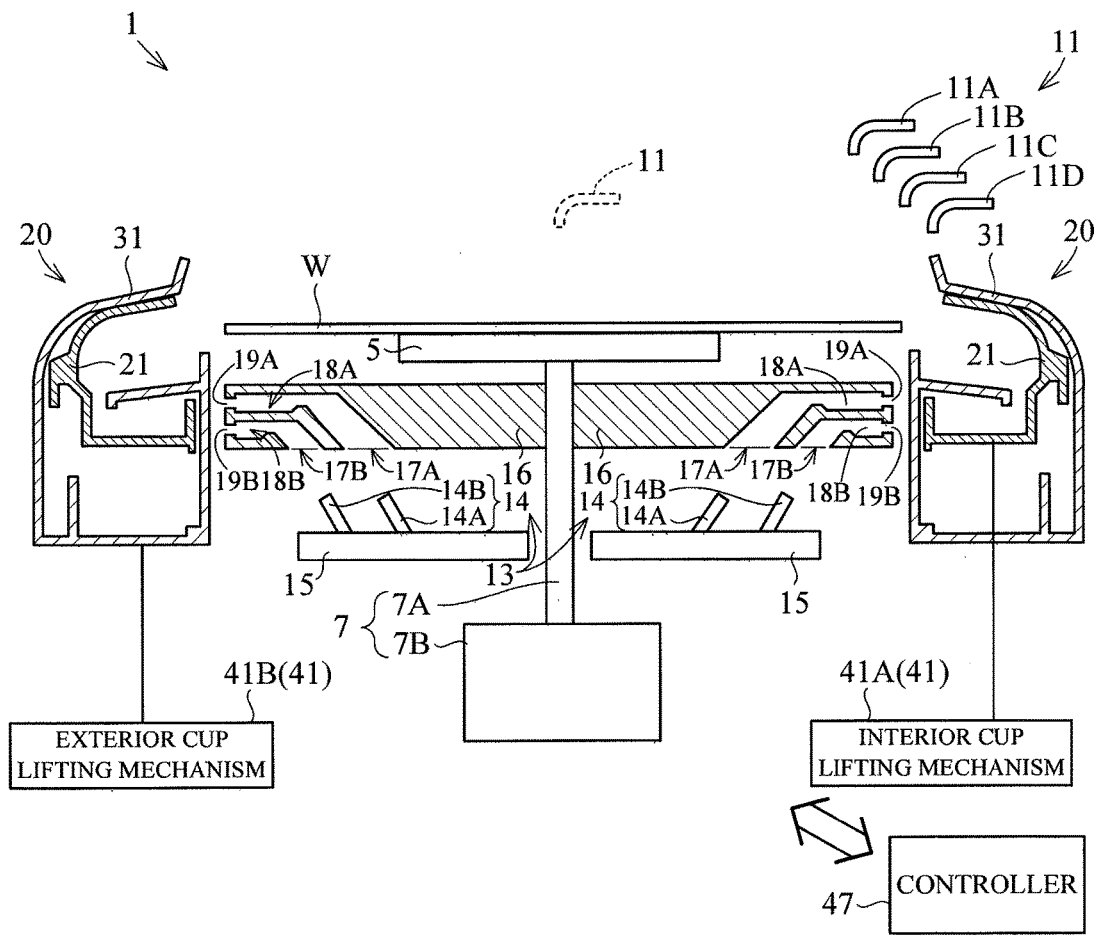
FIG. 2 is a sectional view of the substrate treating apparatus according to Preferred Embodiment 1.

The following describes Preferred Embodiment 1 of the present invention with reference to drawings. FIGS. 1 and 2 are a plan view and a sectional view of a substrate treating apparatus, respectively, according to Preferred Embodiment 1.

A substrate treating apparatus 1 of Embodiment 1 performs treatment to every one substrate with a treatment liquid. More specifically, the substrate treating apparatus 1 allows both negative tone development and positive tone development. The substrate treating apparatus 1 includes a substrate holder 5, a rotating drive unit 7, a treatment liquid supplying unit 11, a cup cleaner 13, a cup 20, and a cup lifting mechanism 41.

<Substrate Holder>
The substrate holder 5 holds one substrate (e.g., a semiconductor wafer) W in a substantially horizontal attitude. The substrate holder 5 suction-holds the center of the backside of the substrate W.

<Rotating Drive Unit>
The rotating drive unit 7 is connected to the substrate holder 5 to rotate the substrate holder 5 substantially around a vertical axis. The rotating drive unit 7 includes a rotary A and a motor 7B. The rotary shaft 7A includes an upper end connected to the substrate holder 5, and includes a lower end connected to the motor 7B. The motor 7B outputs driving force to the rotary shaft 7A.

<Treatment Liquid Supplying Unit>
The treatment liquid supplying unit 11 supplies the treatment liquid to the substrate W held with the substrate holder 5. The treatment liquid supplying unit 11 includes nozzles 11A, 11B, 11C, and 11D each dispensing the treatment liquid downwardly. The nozzles 11A to 11D are each movable between a position (illustrated in the drawing by dotted lines) above the substrate W held with the substrate holder 5 and a position (illustrated in FIG. 2 by solid lines) away from the above of the substrate W.

In the present embodiment, the nozzles 11A and 11B are used for the positive tone development. The nozzle 11A dispenses a treatment liquid as developer for positive tone development. The developer for positive tone development is alkaline developer such as tetra methyl ammonium hydroxide (TMAH). The nozzle 11B dispenses a treatment liquid as a cleaning liquid for positive tone development. The cleaning liquid for positive tone development is, for example, deionized water.

The nozzles 11C and 11D are each used for negative tone development. The nozzle 11C dispenses a treatment liquid as developer for negative tone development. The developer for negative tone development is, for example, developer that contains an organic solvent such as butyl acetate. The nozzle 11D dispenses a treatment liquid as a cleaning liquid for negative tone development. The cleaning liquid for negative tone development contains an organic solvent such as 4-methyl-2-pentanol (MIBC: Methyl Iso Butyl Carbinol).

<Cup Cleaner>
The cup cleaner 13 cleans a cup 20. The cup cleaner 13 includes a cleaning liquid supplying unit 14 and a spray disk 16.

The cleaning liquid supplying unit 14 supplies a treatment liquid (hereinunder, referred to as a "cleaning liquid") for cleaning the cup 20. The cleaning liquid supplying unit 14 includes a plurality of nozzles 14A each for dispensing a cleaning liquid, and a plurality of nozzles 14B each for dispensing another cleaning liquid different from the cleaning liquid from the nozzles 14A. The nozzles 14A and 14B each dispense the cleaning liquids to the spray disk 16. The nozzles 14A and 14B are held on a base plate 15 fixed below the substrate holder 5.

The nozzle 14A dispenses the cleaning liquid for positive tone development such as deionized water. The nozzle 14B dispenses the cleaning liquid for negative tone development containing an organic solvent, for example. The nozzles 14A and 14B are one non-limiting example of the first nozzle and the second nozzle, respectively, in the present invention.

The spray disk 16 sprays the cleaning liquid from the cleaning liquid supplying unit 14 to the cup 20. The spray disk 16 is disposed below the substrate holder 5 and above the cleaning liquid supplying unit 14. The spray disk 16 is in a substantial disc shape. The spray disk 16 is connected to the rotating drive unit 7 (rotary shaft 12A) at the center thereof. The spray disk 16 rotates integratedly with the substrate holder 5.

The spray disk 16 sprays the cleaning liquid from the nozzle 14A and the cleaning liquid from the nozzle 14B laterally of the spray disk 16 without mixing both the cleaning liquids within the spray disk 16. The spray disk 16 includes openings 17A and 17B, reservoirs 18A and 18B, and outlets 19A and 19B. The openings 17A and 17B are formed in a bottom surface of the spray disk 16. The opening 17A receives the cleaning liquid from the nozzle 14A, whereas the opening 17B receives the cleaning liquid from the nozzle 14B. The reservoirs 18A and 18B are formed within the spray disk 16. The reservoir 18A is in fluid communication with the opening 17A for accumulating the cleaning liquid. The reservoir 18B is in fluid communication with the opening 17B for accumulating the cleaning liquid. The outlets 19A and 19B are each formed in an outer periphery surface of the spray disk 16. The outlet 19A is in fluid communication with the reservoir 18A, whereas the outlet 19B is in fluid communication with the reservoir 18B. When the spray disk 16 rotates, the treatment liquid in the reservoir 18A disperses from the outlet 19A, and the treatment liquid in the reservoir 18B disperses from the outlet B.

<Cup and Cup Lifting Mechanism>

The cup 20 collects the treatment liquids supplied to the substrate W. The cup 20 includes an interior cup 21 and an exterior cup 31. The exterior cup 31 surrounds the substrate holder 5 laterally. The interior cup 21 is accommodated within the exterior cup 31. The interior cup 21 includes an inlet A for collecting the treatment liquid. The exterior cup 31 includes an inlet 13 for collecting the treatment liquid.

The cup lifting mechanism 41 moves the interior cup 21 and the exterior cup 31 upward and downward. The cup lifting mechanism 41 includes an interior cup lifting mechanism 41A and an exterior cup lifting mechanism 41B. The interior cup lifting mechanism 41A is connected to the interior cup 21 for moving the interior cup 21 upward and downward. The exterior cup lifting mechanism 41B is connected to the exterior cup 31 for moving the exterior cup 31 upward and downward.

FIGS. 3A to 3D illustrate four arrangement examples of the interior cup 21 and the exterior cup 31. Here FIGS. 3A to 3D illustrate the interior cup 21 and the exterior cup 31 in a simple manner.

Figure 3A:
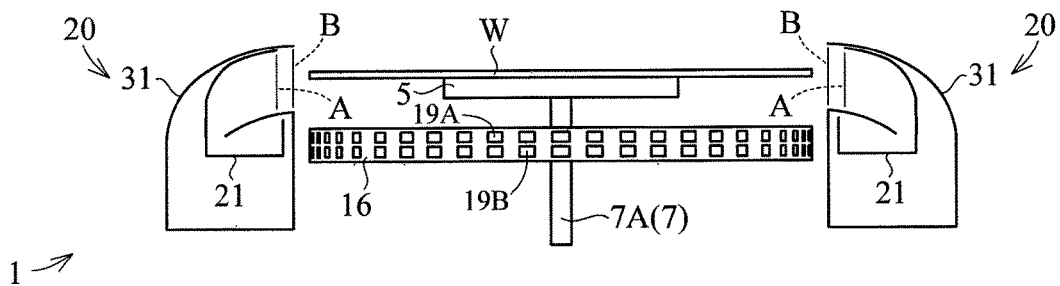
FIGS. 3A to 3D each illustrate one non-limiting example of arrangement of an interior cup and an exterior cup.
Figure 3B:
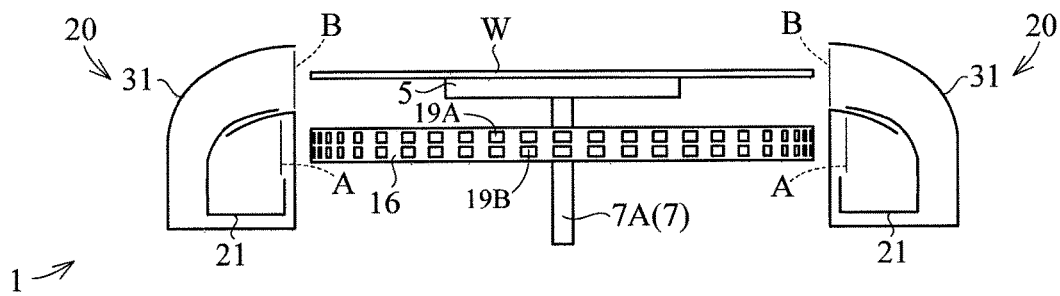
Figure 3C:
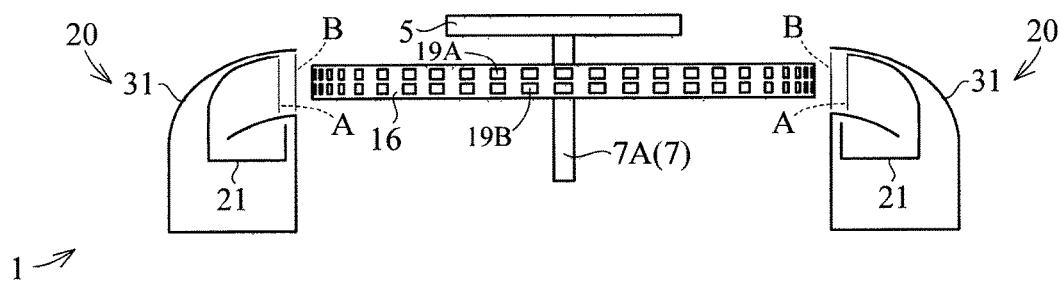
Figure 3D:
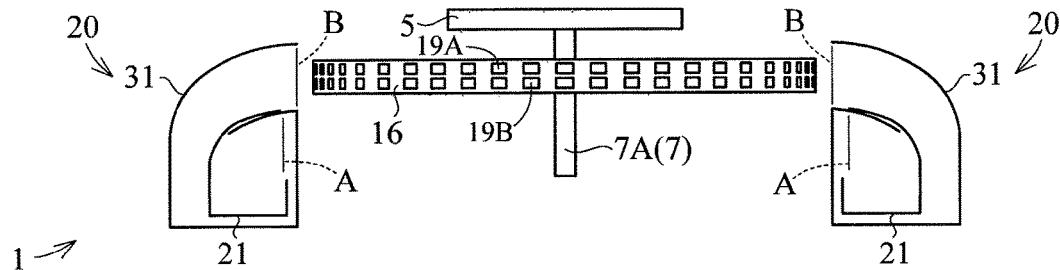

The exterior cup 31 is movable between a treatment position (see FIGS. 3A and 3B) and a cleaning position (see FIGS. 3C and 3D). In the treatment position, the inlet B of the exterior cup 31 is disposed laterally of the substrate holder 5. In the cleaning position, the inlet B of the exterior cup 31 is disposed laterally of the spray disk 16. The cleaning position of the exterior cup 31 is lower in level than the treatment position of the exterior cup 31.

The interior cup 21 is movable relative to the exterior cup 31 between a collecting position (see FIGS. 3A and 3C) and a retracting position (see FIGS. 3B and 3D). In the collecting position, the inlet A of the interior cup 21 is disposed in the substantially same level as the inlet B of the exterior cup 31. The inlet A is opened through the inlet B. The interior cup 21 collects the treatment liquid (containing the treatment liquid dispersed from the substrate W and the treatment liquid sprayed from the spray disk 16). When the interior cup 21 is in the retracting position, the inlet A of the interior cup 21 is lower in level than the inlet B of the exterior cup 31. The inlet B is opened, and the exterior cup 31 collects the treatment liquid. Here, the retracting position of the interior cup 21 is lower in level than the collecting position of the interior cup 21.

In the present embodiment, the positive tone development is performed with the interior cup 21, and the negative tone development is performed with the exterior cup 31. The interior cup 21 is one non-limiting example of the first cup in the present invention. The exterior cup 31 is one non-limiting example of the second cup in the present invention.

<Detailed Configuration of Interior Cup Main Body and Exterior Cup Main Body>

Figure 4A:
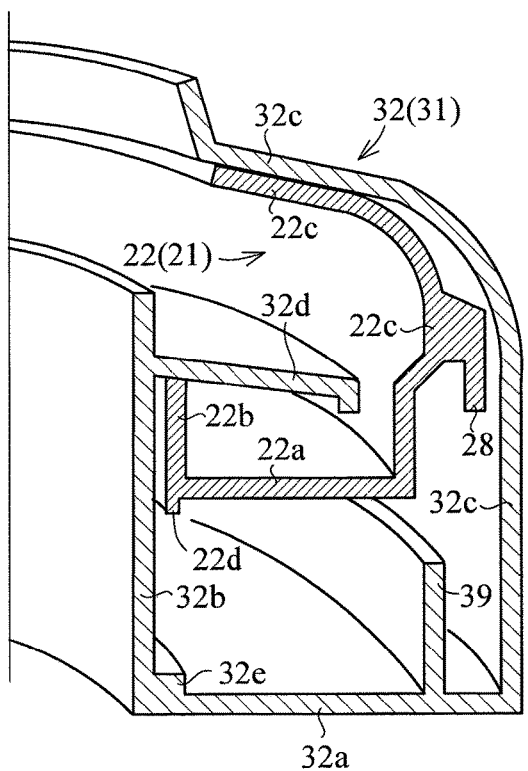
FIGS. 4A and 4B each illustrate a cup in detail.
Figure 4B:
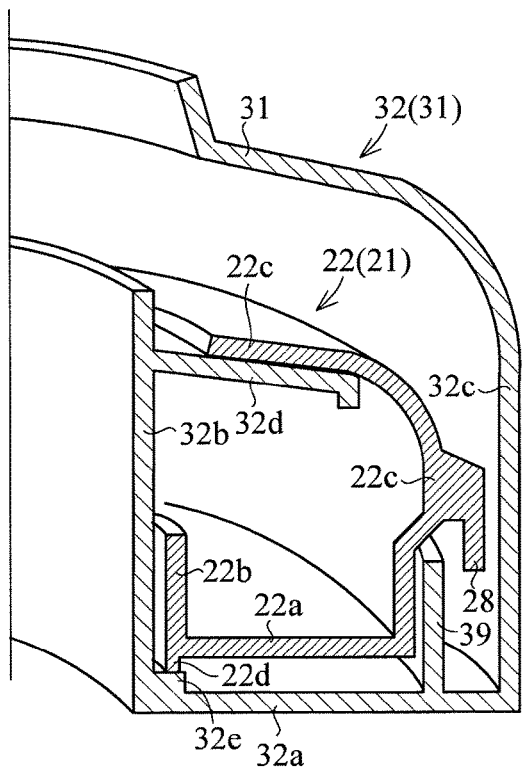

FIGS. 4A and 4B are each a schematic view of the cup 20. In FIG. 4A, the interior cup 21 is in the collecting position, whereas in FIG. 4B, the interior cup 21 is in the retracting position.

The interior cup 21 has a substantially annular contour, and includes a hollow interior cup main body 22. The interior cup main body 22 includes a bottom 22a, an inner periphery wall 22b, and an outer periphery wall 22c. The inner periphery wall 22b includes a lower end connected to the bottom 22a. The outer periphery wall 22c includes a lower end connected to the bottom 22a outside of the inner periphery wall 22b. The outer periphery wall 22c includes an upper end inclined inwardly. The inlet A mentioned above is formed between the upper end of the inner periphery wall 22b and the upper end of the outer periphery wall 22c. The interior cup main body 22 further includes an annular projection 22d projecting downwardly from the inner edge of the bottom 22a. Here, the term "inward" means a direction facing to the center of the interior cup main body 22/exterior cup main body 32, and the term "outward" means a direction opposite to the "inward". The center of the interior cup main body 22 and/or exterior cup main body 32 substantially conforms to an axis of the rotary shaft 7A, for example.

The exterior cup 31 includes an exterior cup main body 32 having a substantially annular contour. The exterior cup main body 32 includes a bottom 32a, an inner periphery wall 32b, and an outer periphery wall 32c. The parts 32a to 32c are each substantially equal in configuration to the parts 22a to 22c of the interior cup main body 22.

The exterior cup main body 32 further includes a flange 32d and an annular step 32e. The flange 32d extends outwardly from the inner periphery wall 32b in a substantially horizontal direction. The flange 32d partially enters into the interior cup main body 22 through the inlet A of the interior cup 21. The step 32e protrudes upward from a corner of the bottom 32a connected to the inner periphery wall 32b.

When the interior cup 21 is in the collecting position as illustrated in FIG. 4A, the outer periphery wall 22c of the interior cup main body 22 contacts the outer periphery wall 32c of the exterior cup main body 32, and the inner periphery wall 22b of the interior cup main body 22 contacts the flange 32d of the exterior cup main body 32. This causes the interior cup main body 22 to close the inlet B of the exterior cup main body 32, thereby preventing the exterior cup 31 from collecting the treatment liquid.

When the interior cup 21 is in the retracting position as illustrated in FIG. 4B, the outer periphery wall 22c of the interior cup main body 22 contacts the flange 32d, and the projection 22d of the interior cup main body 22 contacts the step 32e of the exterior cup main body 32. This causes the exterior cup main body 32 to close the inlet A of the interior cup 21, thereby preventing the interior cup 21 from collecting the treatment liquid.

<Detailed Configuration of Effluent/Exhaust of Interior Cup>

Figure 5A:
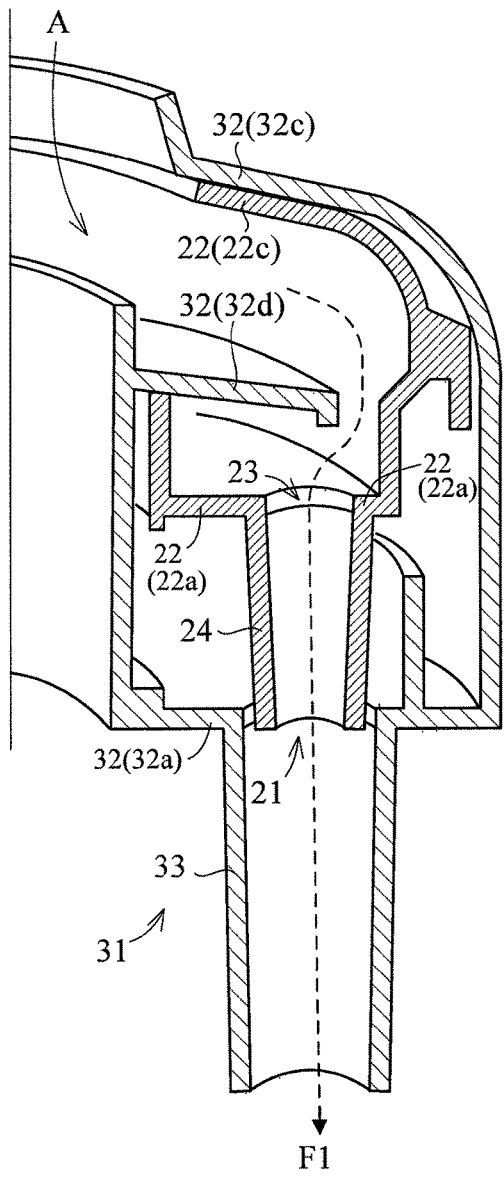
FIGS. 5A and 5B each illustrate the cup in detail.
Figure 5B:
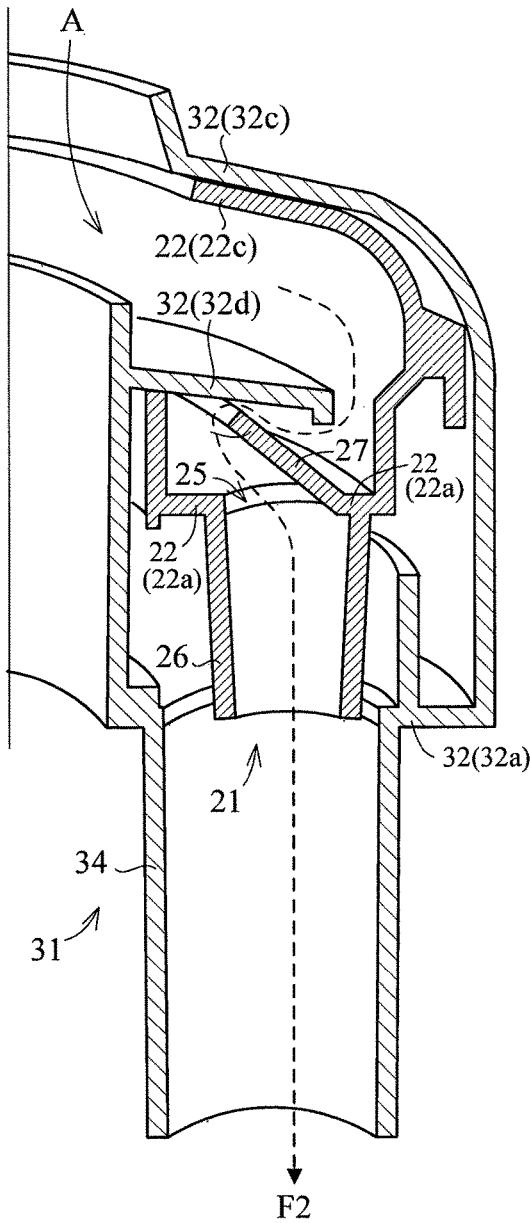
Figure 6:
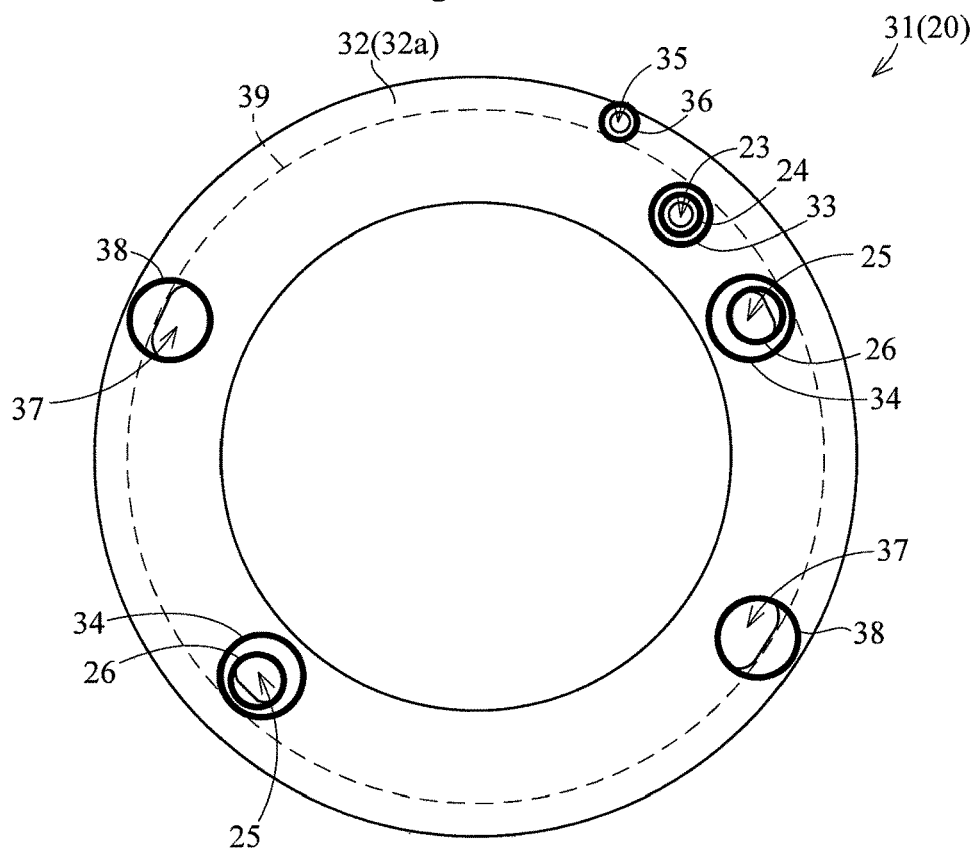
FIG. 6 is a bottom view of the cup.
Figure 7:
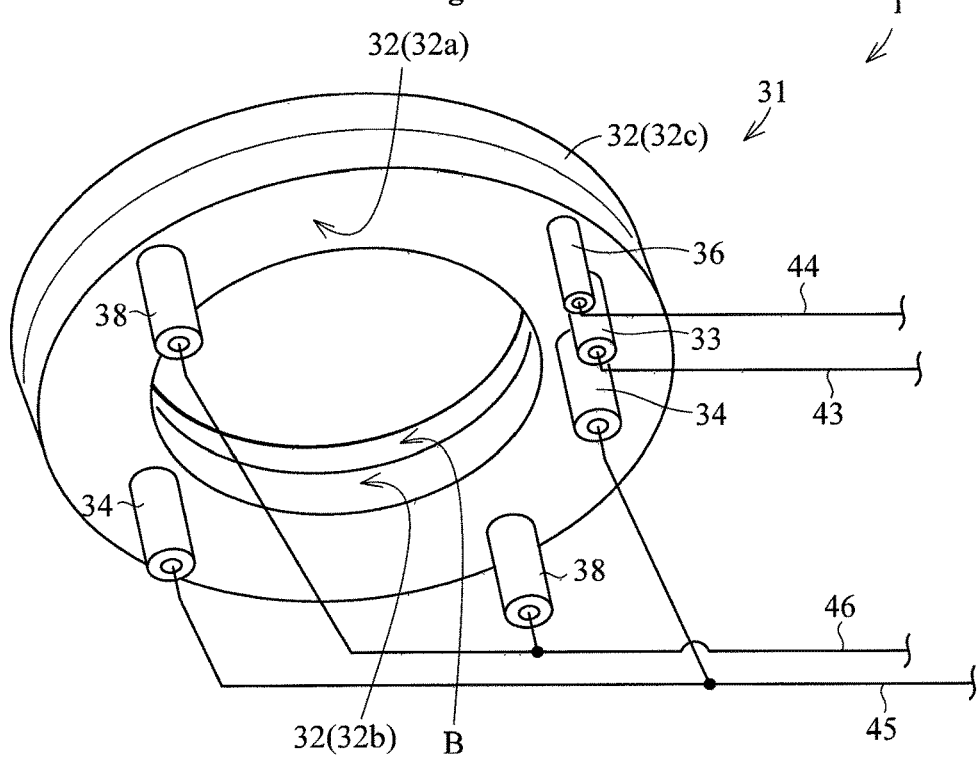
FIG. 7 is a perspective view of the bottom of the cup seen from below.

FIG. 5A illustrates an effluent configuration of the interior cup 21. FIG. 5B illustrates an exhaust configuration of the interior cup 21. Here in both FIGS. 5A and 5B, the interior cup 21 is in the collecting position. FIG. 6 is a bottom view of the cup 20. FIG. 7 is a perspective view of the cup 20 seen from the bottom thereof.

The interior cup 21 includes one drain outlet 23 and one drain tube 24. The drain outlet 23 is formed in the interior cup main body 22 (bottom 22a) for draining the treatment liquid in the interior cup main body 22 outside the interior cup main body 22. The drain tube 24 is connected to the interior cup main body 22 (bottom 22a) for passing the treatment liquid drained from the drain outlet 23. FIG. 5A schematically illustrates a flow F1 of the treatment liquid in the interior cup main body 22.

The exterior cup 31 includes one extension drain tube 33 so as to extend the drain tube 24. The extension drain tube 33 is connected to the exterior cup main body 32 (bottom 32a). The extension drain tube 33 has a diameter larger than the drain tube 24. The extension drain tube 33 accommodates the drain tube 24 such that the drain tube 24 is movable vertically. The extension drain tube 33 passes the treatment liquid drained from the drain tube 24. In, this manner, the drain tube 24 follows the extension drain tube 33, leading to reduction in length of the drain tube 24.

The lower end of the drain tube 24 is inserted into the extension drain tube 33 even when the interior cup 21 is in collecting position. Consequently, the treatment liquid from the drain tube 24 does not flow into the exterior cup main body 32. When the interior cup 21 is in the collecting position, the lower end of the drain tube 24 is preferably disposed above the lower end of the extension drain tube 33. This allows reduction in length of the drain tube 24, reduction in height of the interior cup 21, and thus reduction in entire height of the cup 20. In addition, when the interior cup 21 is in the collecting position, a part of the drain tube 24 inserted into the extension drain tube 33 preferably has a length of 80 mm or less. This allows more reduction in length of the drain tube 24.

The interior cup 21 includes two exhaust ports 25 and two exhaust tubes 26. The exhaust ports 25 are each formed in the interior cup main body 22 (bottom 22a) for exhausting the gas within the interior cup main body 22 (containing mist in the treatment liquid) outside the interior cup main body 22. The exhaust tubes 26 are connected to the interior cup main body 22 (bottom 22a) to pass the gas from the exhaust ports 25. FIG. 5B schematically illustrates a gas flow F2 within the interior cup main body 22.

The exterior cup 31 includes two extension exhaust tubes 34 so as to extend the exhaust tubes 26 respectively. The extension exhaust tube 34 is connected to the exterior cup main body 32 (bottom 32a). The extension exhaust tube 34 has a diameter larger than the exhaust tube 26. The extension exhaust tube 34 accommodates the exhaust tube 26 such that the exhaust tube 26 is movable vertically. The extension exhaust tube 34 passes the gas from the exhaust tube 26. In this manner, the exhaust tube 26 follows the extension exhaust tube 34, leading to reduction in length of the exhaust tube 26.

The lower end of the exhaust tube 26 is inserted into the extension exhaust tube 34 even when the interior cup 21 is in the collecting position. Consequently, the gas from the exhaust tube 26 does not flow into the exterior cup main body 32. When the interior cup 21 is in the collecting position, the lower end of the exhaust tube 26 is preferably disposed above the lower end of the extension exhaust tube 34. This allows reduction in length of the exhaust tube 26, reduction in height of the interior cup 21, and thus reduction in entire height of the cup 20. In addition, when the interior cup 21 is in the collecting position, a part of the exhaust tube 26 inserted into the extension exhaust tube 34 preferably has a length 80 mm or less. This allows more reduction in length of the exhaust tube 26.

The interior cup 21 includes a hood 27 covering the upper side of the exhaust port 25. The hood 27 prevents the treatment liquid from flowing into the exhaust port 25. The hood 27 is disposed inside of the interior cup main body 22. In the present embodiment, the hood 27 includes a proximal end connected to the bottom 22a adjacent to the exhaust port 25. The hood 27 includes a distal end extending above the exhaust port 25 at a position lower in level than the inlet A of the interior cup 21. The hood 27 allows the gas within the interior cup main body 22 to flow into the exhaust port 25. The hood 27 is one non-limiting example of the cover in the present invention.

The flange 32d mentioned above also covers the exhaust port 25 to prevent the treatment liquid from flowing into the exhaust port 25. The flange 32d functions as the cover in the present invention.

<Detailed Configuration of Effluent/Exhaust of Exterior Cup>

FIG. 8A illustrates an effluent configuration of the exterior cup 31. FIG. 8B illustrates an exhaust configuration of the exterior cup 31. In FIGS. 8A and 8B, the interior cup 21 is in the retracting position.

The exterior cup 31 includes one drain outlet 35, one drain tube 36, two exhaust ports 37, and two exhaust tubes 38. The drain outlet 35 and the exhaust ports 37 are formed in the exterior cup main body 32 (bottom 32a). The drain tube 36 and the exhaust tubes 38 are connected to the exterior cup main body 32 (bottom 32a). The drain outlet 35 drains the treatment liquid in the exterior cup main body 32. The drain tube 36 passes the treatment liquid drained from the drain outlet 35. The exhaust ports 37 each exhaust gas (containing mist in the treatment liquid) in the exterior cup main body 32. The exhaust tubes 38 each pass the gas from the exhaust ports 37. FIG. 8A schematically illustrates a flow F3 of the treatment liquid in the exterior cup main body 32. FIG. 8B schematically illustrates a gas flow F4 in the exterior cup main body 32.

The exterior cup 31 further includes an annular partition wall 39 that partitions the drain outlet 35 and the exhaust port 37. The partition wall 39 is disposed outward of the inner periphery wall 32b and inward of the outer periphery wall 32c. The partition wall 39 protrudes upward from the bottom 32a. The drain outlet 35 is disposed outside the partition wall 39. The exhaust port 37 is disposed inside the partition wall 39.

The interior cup main body 22 moves vertically inside the partition wall 39. This allows the interior cup main body 22 to cover the upper side of the exhaust port 37, thereby preventing the treatment liquid in the exterior cup main body 32 from flowing into the exhaust port 37. Especially, when the interior cup 21 is in the retracting position, the interior cup main body 22 is lower in level than the inlet B of the exterior cup 31. This allows accurate prevention of the treatment liquid from dropping into the exhaust port 37.

A collar 28 is attached to the outer periphery wall 22c of the interior cup main body 22 for guiding the treatment liquid outside the partition wall 39. A tip of the collar 28 extends outwardly and downwardly from the periphery wall 22c. When the interior cup 21 is in the retracting position, the tip of the collar 28 is disposed below the upper end of the partition wall 39 and outside the partition wall 39. That is, the upper end of the partition wall 39 is accommodated in a gap between the collar 28 and the outer periphery wall 22c. In this manner, when covering the upper end of the partition wall 39, the collar 28 guides the treatment liquid in the exterior cup main body 32 outside the partition wall 39. This allows the collar 28 to prevent the treatment liquid from flowing into the exhaust port 37. In addition, even when the interior cup 21 is in the retracting position, the gas in the exterior cup main body 32 can pass through the gap between the collar 28 and the partition wall 39 into the exhaust port 37.

<Effluent Duct and Exhaust Duct>

Reference is made to FIG. 7. The substrate treating apparatus 1 includes effluent ducts 43 and 44. The effluent duct 43 is connected to the lower end of the extension drain tube 33 to flow the treatment liquid drained from the extension drain tube 33. The effluent duct 44 is connected to the lower end of the drain tube 36 to flow the treatment liquid drained from the drain tube 36.

The substrate treating apparatus 1 further includes exhaust ducts 45 and 46. The exhaust duct 45 is connected to the lower end of the extension exhaust tubes 34 to flow the gas exhausted from the extension exhaust tubes 34. The exhaust duct 46 is connected to the lower end of the exhaust tubes 38 to flow the gas exhausted from the exhaust tubes 38.

<Controller>

Reference is made to FIG. 2. The substrate treating apparatus 1 includes a controller 47. The controller 47 controls en bloc the rotating drive unit 7, the treatment liquid supplying unit 11, the cleaning liquid supplying unit 14, and the cup lifting mechanism 41.

Figure 9:
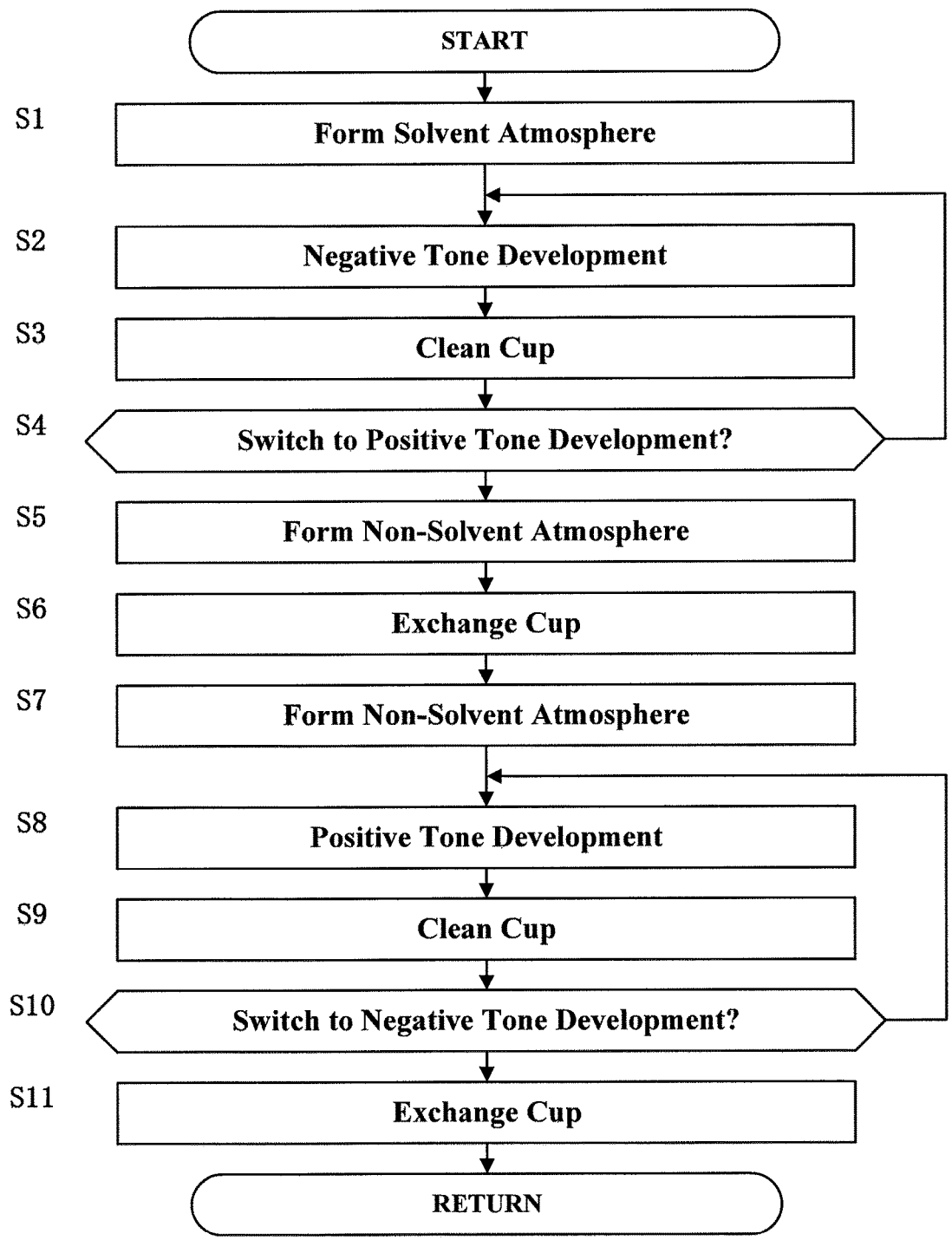
FIG. 9 is a flow chart of operation of the substrate treating apparatus according to Preferred Embodiment 1.

The following describes operation of the substrate treating apparatus 1 according to Preferred Embodiment 1. FIG. 9 is a flow chart illustrating operation of the substrate treating apparatus 1.

<Step S1> Form Solvent Atmosphere

It is assumed that, prior to this step S1, the exterior cup 31 is in the cleaning position and the interior cup 21 is in the retracting position. In the step S1, an atmosphere containing an organic solvent (hereinafter, referred to as a "solvent atmosphere") is formed. Specifically, the nozzle 16B dispenses a cleaning liquid for negative tone development, and the rotating drive unit 7 rotates the spray disk 16. This allows the cup cleaner 13 to disperse the cleaning liquid for negative tone development to the exterior cup 31. The dispersed cleaning liquid is partially volatilized, and a solvent atmosphere is formed inside the exterior cup 31 (e.g., inside the exterior cup main body 32) or laterally of the spray disk 16.

The cleaning liquid dispersed to the exterior cup main body 32 is drained through the drain outlet 35 and the drain tube 36 to the outside of the cup 20 (i.e., the effluent duct 44). The gas within the exterior cup main body 32 is drained through the exhaust port 37 and the exhaust tube 38 to the outside of the cup 20 (i.e., the exhaust duct 46).

<Step S2> Negative Tone Development

A substrate transport mechanism, not shown, places the substrate W on the substrate holder 5. The substrate W includes a top face having an exposed resist film. The exterior cup lifting mechanism 41B moves the exterior cup 31 into the treatment position. The interior cup lifting mechanism 41A moves the interior cup 21 into the retracting position while the exterior cup 31 is in the treatment position. Accordingly, the solvent atmosphere is formed around the substrate W.

The substrate treating apparatus 1 performs negative tone development to the substrate W in accordance with processing recipes set in advance. For instance, the nozzle 13C is moved above the substrate W to supply developer for negative tone development to the substrate W. Subsequently, the nozzle 13D is moved above the substrate W to supply a cleaning liquid for negative tone development to the substrate W. Meanwhile, the rotating drive unit 7 rotates the substrate W appropriately. Through the negative tone development, a non-exposed part of the resist film is dissolved and removed.

The exterior cup 31 collects the treatment liquid used for the negative tone development. Specifically, the exterior cup main body 32 receives the treatment liquid spread out from the substrate W. The drain outlet 35 and the drain tube 36 each drain the treatment liquid within the exterior cup main body 32 to the outside of the cup 20. The exhaust port 37 and the exhaust tube 38 each exhaust the gas within the exterior cup main body 32 to the outside of the cup 20.

After the negative tone development, the cup lifting mechanism 41 moves the exterior cup 31 to the cleaning position, and moves the interior cup 21 to the retracting position while the exterior cup 31 is in the cleaning position. The substrate transport mechanism, not shown, transports the substrate W from the substrate holder 5.

<Step S3> Clean Cup

The cup cleaner 13 cleans the exterior cup 31. Specifically, the cup cleaner 13 disperses a cleaning liquid for negative tone development to the exterior cup 31 to clean away the treatment liquid used for the negative tone development. Also at this time, the treatment liquid within the exterior cup main body 32 is drained through the drain outlet 35, and the gas within the exterior cup main body 32 is exhausted through the exhaust port 37.

<Step S4> Switch to Positive Tone Development?

The process proceeds to a step S5 if the negative tone development is switched to the positive tone developing process. Otherwise, the process returns to the step S2, and the negative tone development is repeatedly performed to another substrate W.

<Step S5> Form Non-Solvent Atmosphere

An atmosphere substantially containing no organic solvent (hereinunder referred to as a "non-solvent atmosphere") is formed in the exterior cup 31. Specifically, the nozzle 16A dispenses developer for positive tone development, and the rotating drive unit 7 rotates the spray disk 16. This causes the cup cleaner 13 to disperse the cleaning liquid for positive tone development to the exterior cup 31. Consequently, the organic solvent adhering on the exterior cup 31 or the organic solvent floating in the exterior cup 31 are cleaned away to form a non-solvent atmosphere in the exterior cup 31. Here, the "non-solvent atmosphere" is not limited to an atmosphere containing no organic solvent, but may be an atmosphere slightly containing an organic solvent to an extent that does not substantially influence the positive tone development.

<Step S6> Exchange Cup

The cup lifting mechanism 41 moves the interior cup 21 to the collecting position while keeping the exterior cup 31 in the cleaning position.

<Step S7> Form Non-Solvent Atmosphere

A non-solvent atmosphere is formed in the interior cup 21. Specifically, the cup cleaner 13 sprays the cleaning liquid for positive tone development to the interior cup 21.

The cleaning liquid sprayed to the interior cup main body 22 is drained through the drain outlet 23, the drain tube 24, and the extension drain tube 33 to the outside of the cup 20 (i.e., the effluent duct 43). The gas within the interior cup main body 22 is exhausted through the exhaust port 25, the exhaust tube 26, and the exhaust extension tube 34 to the outside of the cup 20 (i.e., the exhaust duct 46).

<Step S8> Positive Tone Development

The substrate transport mechanism places one substrate W on the substrate holder 5. The cup lifting mechanism 41 moves the exterior cup 31 to the treatment position, and moves the interior cup 21 to the collecting position while the exterior cup 31 is in the treatment position. Accordingly, a non-solvent atmosphere is formed around the substrate W.

The substrate treating apparatus 1 performs a positive tone development to the substrate W in accordance with processing recipes set in advance. For instance, the nozzle 13A is moved above the substrate W to supply developer for positive tone development to the substrate W. Subsequently, the nozzle 13B is moved above the substrate W to supply a cleaning liquid for positive tone development to the substrate W. Meanwhile, the rotating drive unit 7 rotates the substrate W appropriately. Through the positive tone development, an exposed part of the resist film is dissolved and removed.

The interior cup 21 collects the treatment liquid used for the positive tone development. Specifically, the interior cup main body 22 receives the treatment liquid dispersed out of the substrate W. The drain outlet 23, the drain tube 24, and the extension drain tube 33 each drain the treatment liquid within the interior cup main body 22 to the outside of the cup 20. The exhaust port 25, the exhaust tube 26, and the extension exhaust tube 34 each exhaust the gas within the interior cup main body 22 to the outside of the cup 20.

After the positive tone development, the cup lifting mechanism 41 moves the exterior cup 31 to the cleaning position, and moves the interior cup 21 to the collecting position while the exterior cup 31 is in the cleaning position. The substrate transport mechanism transports the substrate W from the substrate holder 5.

<Step S9> Clean Cup

The cup cleaner 13 cleans the interior cup 21 with the cleaning liquid for positive tone development. Also at this time, the treatment liquid within the interior cup main body 22 is drained from the drain outlet 23, and the gas within the interior cup main body 22 is exhausted from the exhaust port 25.

<Step S10> Switch to Negative Tone Development?

The process proceeds to a step S11 if the positive tone development is switched to the negative tone development. Otherwise, the process returns to the step S8, and the positive tone development is repeatedly performed to another substrate W.

<Step S11> Exchange Cup

The cup lifting mechanism 41 moves the interior cup 21 to the retracting position while keeping the exterior cup 31 in the cleaning position. Then the process returns to the step S1.

In the non-limiting example of operation mentioned above, the step S1 corresponds to the "first pre-spraying step of spraying in advance a cleaning liquid for negative tone development to the second cup" and the "solvent atmosphere pre-forming step" in the present invention. The step S2 corresponds to the "negative tone developing step" in the present invention. The steps S5 and S7 correspond to the "non-solvent atmosphere pre-forming step" in the present invention. The step S5 corresponds to the "spraying step of spraying the cleaning liquid for positive tone development to the second cup" in the present invention. The step S7 corresponds to the "second pre-spraying step of spraying in advance a cleaning liquid for positive tone development to the first cup" in the present invention.

<Effect>

With the present embodiment 1, the substrate treating apparatus 1 includes the interior cup 21 and the exterior cup 31. The interior cup 21 is movable between the collecting position and the retracting position. Such movement, of the interior cup 21 allows easy exchange between the interior cup 21 and the exterior cup 31. Consequently, the present embodiment allows selective performance of the positive tone development or negative tone development to the substrate W.

When the interior cup 21 is in the collecting position, the interior cup 21 closes the inlet B of the exterior cup 31. In contrast to this, when the interior cup 21 is in the retracting position, the exterior cup 31 closes the inlet A of the interior cup 21. Accordingly, this prevents the treatment liquid used for negative tone development from adhering to the interior cup 21, leading to high-quality performance of the positive tone development with the interior cup 21. Similarly, this prevents the treatment liquid used for the positive tone development from adhering to the exterior cup 31, leading to high-quality performance of the negative tone development with the exterior cup 31. In addition, the cup cleaner 13 allows atmosphere formation of the cups 21 and 31 individually.

The exterior cup 31 accommodates the interior cup 21, leading to reduction in entire size of the cup 20.

The interior cup 21 includes the interior cup main body 22, the drain outlet 23, and the exhaust ports 25. The exterior cup 31 includes the exterior cup main body 32, the drain outlet 35, and the exhaust ports 37. Accordingly, this allows individual discharge of the treatment liquid within the interior cup main body 22, the gas within the interior cup main body 22, the treatment liquid within the exterior cup main body 32, and the gas within the exterior cup main body 32. Consequently, this prevents the treatment liquid within the interior cup main body 22 from being mixed with the treatment liquid within the exterior cup main body 32. In addition, this prevents the gas within the interior cup main body 22 from being mixed with the gas within the exterior cup main body 32. As a result, high-quality process is performable to the substrate W with any of the interior cup 21 and the exterior cup 31.

The exterior cup 31 includes the extension drain tube 33 in fluid communication with the drain tube 24. This allows reduction in length of the drain tube 24, leading to reduction in size of the interior cup 21. Moreover, the treatment liquid within the interior cup main body 22 can be drained to the outside of the cup 20 without passing through the exterior cup main body 32.

Similarly, the exterior cup 31 includes the extension exhaust tube 34 in fluid communication with the exhaust tube 26. This allows reduction in length of the exhaust tube 26, leading to reduction in size of the interior cup 21. Moreover, the gas within the interior cup main body 22 can be exhausted to the outside of the cup 20 without passing through the exterior cup main body 32.

The interior cup 21 includes the hood 27, whereby the treatment liquid is prevented from flowing into the exhaust port 25. Moreover, the flange 32d of the exterior cup main body 32 functions as the cover for the exhaust port 25. This ensures to further prevent the treatment liquid from flowing into the exhaust port 25.

The exterior cup 31 includes the partition wall 39, whereby the treatment liquid is prevented from flowing into the exhaust port 37. Moreover, the interior cup main body 22 covers the upper side of the exhaust port 37. This ensures to further prevent the treatment liquid from flowing into the exhaust port 37. Moreover, the interior cup 21 includes the collar 28. This ensures to further prevent the treatment liquid from flowing into the exhaust port 37.

The substrate treating apparatus 1 includes the cup lifting mechanism 41. Consequently, the interior cup 21 allows ease movement between the collecting position and the retracting position. Moreover, the cup lifting mechanism 41 allows the exterior cup 31 to move to the cleaning position. Consequently, the substrate transport mechanism can access the substrate holder 5 while the substrate holder 5 is not moved vertically. Moreover, the cup cleaner 13 can spray the cleaning liquid to the cup 20 while the spray disk 16 is not moved vertically. As a result, the spray disk 16 is fixable to the rotary shaft 7A.

The solvent atmosphere is formed when the positive tone development is switched to the negative tone development (step S1). Consequently, treatment is performable to the substrate W under the solvent atmosphere from the first negative tone development previously after the switching. As a result, development defect is avoidable even in the first negative tone development previously after the switching. As noted above, an environment suitable for the negative tone development is formed prior to the negative tone development, leading to high-quality treatment to the substrate W.

In the step S1, the solvent atmosphere is formed in the exterior cup 31. Accordingly, an environment suitable for the negative tone development is formable around the substrate W to which the negative tone development is performed. Moreover, in the step S1, the cleaning liquid for negative tone development is sprayed to the exterior cup 31, whereby effective formation of the solvent atmosphere is obtainable.

The non-solvent atmosphere is formed when the negative tone development is switched to the positive tone development (steps S5, S7). Accordingly, treatment is performable to the substrate W under the non-solvent atmosphere from the first positive tone development previously after the switching. As a result, development defect is avoidable even in the first positive tone development previously after the switching. As noted above, an environment suitable for the positive tone development is formed prior to the positive tone development, leading to high-quality treatment to the substrate W.

In the step S7, the non-solvent atmosphere is formed in the interior cup 21. Accordingly, an environment suitable for the positive tone development is formable around the substrate W to which the positive tone development is performed. Moreover, in the step S5, the cleaning liquid for positive tone development is sprayed to the interior cup 21, whereby effective formation of the non-solvent atmosphere is obtainable.

In the step S5, the non-solvent atmosphere is also formed in the exterior cup 31. Accordingly, this ensures to form an environment suitable for the positive tone development. In other words, this prevents the treatment liquid remaining in the exterior cup 31 from inhibiting formation of the non-solvent atmosphere.

Embodiment 2

Figure 10:
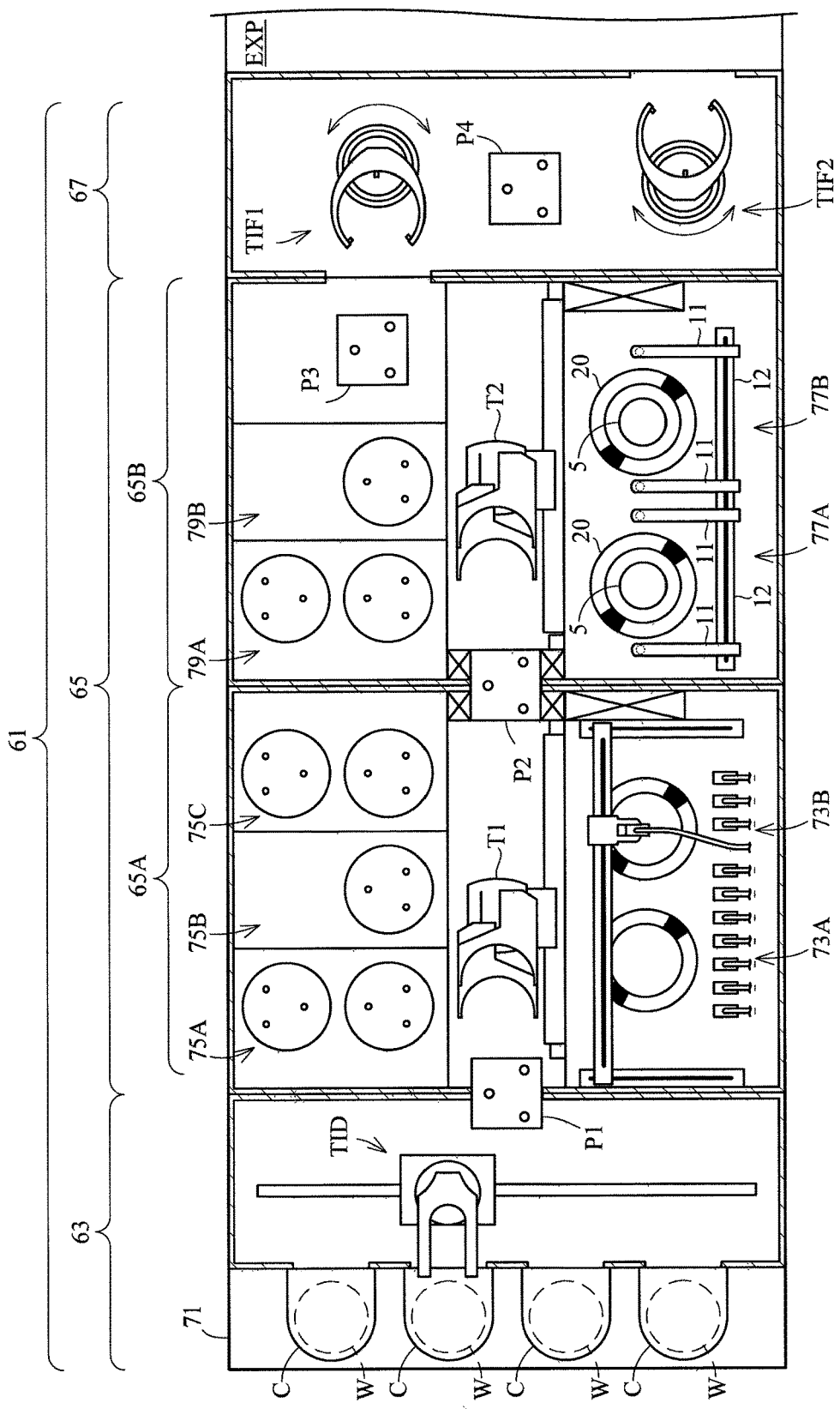
FIG. 10 is a schematic plan view of a substrate treating apparatus according to Preferred Embodiment 2.

The following describes Preferred Embodiment 2 of the present invention with reference to drawings. FIG. 10 is a schematic plan view of a substrate treating apparatus according to Embodiment 2. The substrate treating apparatus 61 of Embodiment 2 performs a process of forming a resist film and development to a substrate W.

The substrate treating apparatus 61 includes an indexer (hereinafter, referred to as an "ID section") 63, a treating section 65, and an interface (hereinafter, referred to as a "IF section") 67. The treating section 65 includes two treating blocks 65A and 65B. The ID section 63, the treating block 65A, the treating block 65B, and the IF section 67 are connected in this order in line. The IF section 67 is adjoined to an exposing machine EXP as an external apparatus, which is different from the apparatus 61.

The ID section 63 includes a mount table 71 that receives cassettes C, and an ID's transport mechanism TID that transports the substrates W. The cassettes each accommodate a plurality of substrates W. A receiver P1 on which the substrate W is placed is disposed between the ID section 63 and the treating block 65A. The ID's transport mechanism TID is accessible to the cassettes C and the receiver P1.

The treating block 65A includes a main transport mechanism T1, a plurality of liquid treating units 73A and 73B, and a plurality of heat treating units 75A, 75B, and 75C. The main transport mechanism T1 transports the substrate W. The liquid treating units 73A and 73B are disposed on a first side of the main transport mechanism T1. The liquid treating units 73A and 73B each supply a treatment liquid to the substrate W. The liquid treating units 73A and 73B are each a coating unit, for example, for coating the substrate W with a resist film material. The heat treating units 75A, 75B, and 75C are disposed on a second side of the main transport mechanism T1. The heat treating units 75A, 75B, and 75C each heat or cool the substrate W. A receiver P2 on which the substrate W is placed is disposed between the treating block 65A and the treating block 65B. The main transport mechanism T1 is accessible to the receivers P1, P2, the coating units 73A and 73B, and the heat treating units 75A to 75C.

The treating block 65B includes a main transport mechanism T2 that transports the substrate W, a plurality of liquid treating units 77A and 77B disposed on a first side of the main transport mechanism T2, and a plurality of heat treating units 79A and 79B disposed on a second side of the main transport mechanism T2. The treating block 65B further includes a receiver P3 adjacent to the IF section 67, and the substrate W is placed on the receiver P3. The main transport mechanism T2 is accessible to the receivers P2 and P3, the liquid treating units 77A and 77B, and the heat treating units 79A and 79B.

The liquid treating units 77A and 77B are each a developing unit that develops the substrate W. The developing units 77A and 77B each include the elements 5 to 46 described in the Preferred Embodiment 1, thereby allowing performance of the positive tone development and negative tone development to the substrate W. As illustrated in FIG. 10, the liquid treating units 77A and 77B further include a moving mechanism 12 that moves the treatment liquid supplying unit 11. Here, the developing units 77A and 77B may or may not include the controller 47 in the Preferred Embodiment 1. For instance, a controller, not shown, external of the developing units 77A and 77B may control the developing units 77A and 77B.

Figure 11:
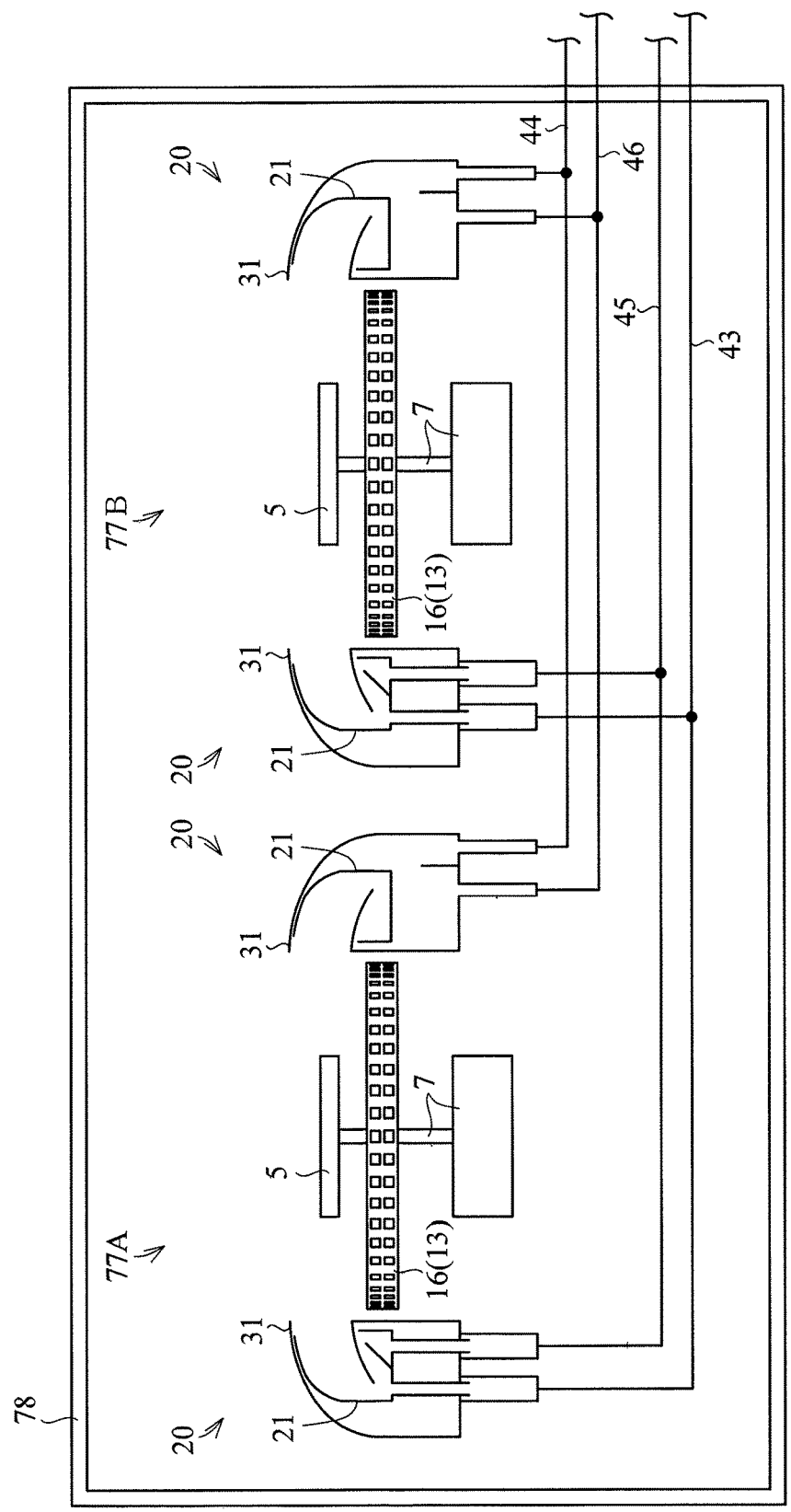
FIG. 11 is a side view of a developing unit.

FIG. 11 is a side view of the developing units 77A and 77B. The developing units 77A and 77B are accommodated in the same chamber 78. That is, the developing units 77A and 77B are disposed in the same space. Moreover, the effluent ducts 43 and 44, and the exhaust ducts 45 and 46 are commonly used in the developing units 77A and 77B.

Reference is again made to FIG. 10. The IF section 67 includes IF's transport mechanisms TIF1 and TIF2 for IF that transport the substrate W, and a receiver P4 on which the substrate W is placed. The receiver P4 may have a function of cooling the placed substrate W to a given temperature. The IF's transport mechanism TIF1 is accessible to the receivers P3 and P4. The IF's transport mechanism TIF2 is accessible to the receiver P4. The IF's transport mechanism TIF2 transports the substrate W to and from the exposing machine EXP.

The following describes operation of the substrate treating apparatus 61 in a simple manner.

<Example of Transporting Substrate W from ID Section 63 to IF Section 67>

The ID's transport mechanism TID transports a substrate W from the cassette C, and places the substrate W onto the receiver P1. The main transport mechanism T1 receives the substrate W from the receiver P1, and transports the substrate W to the coating units 77A and 77B, and the heat treating units 79A to 79C, in a given order. The treating units 77 and 79 each perform treatment to the substrate W. As a result, a resist film is formed on the substrate W. The main transport mechanism T1 places the substrate W, having the resist film formed thereon, onto the receiver P2. The main transport mechanism T2 receives the substrate W on the receiver P2, and places the substrate W onto the receiver P3. The IF's transport mechanism TIF1 receives the substrate W on the receiver P3, and places the substrate W onto the receiver P4. The IF's transport mechanism TIF2 receives the substrate W on the receiver P4, and transports the substrate W to the exposing machine EXP.

<Example of Transporting Substrate W from IF Section 67 to ID Section 63>

The IF's transport mechanism TIF2 receives an exposed substrate W from the exposing machine EXP, and transports the substrate W to the IF's transport mechanism TIF1. The IF's transport mechanism TIF1 transports the substrate W to the main transport mechanism T2. The main transport mechanism T2 transports the substrate W to the developing units 77A and 77B and the heat treating units 79A and 79B. The treating units 77 and 79 each perform treatment to the substrate W. As a result, the substrate W is developed. The main transport mechanism T2 transports the developed substrate W to the main transport mechanism T1. The main transport mechanism T1 transports the substrate W to the ID's transport mechanism TID. The ID's transport mechanism TID transports the substrate W into the cassette C.

Figure 12:
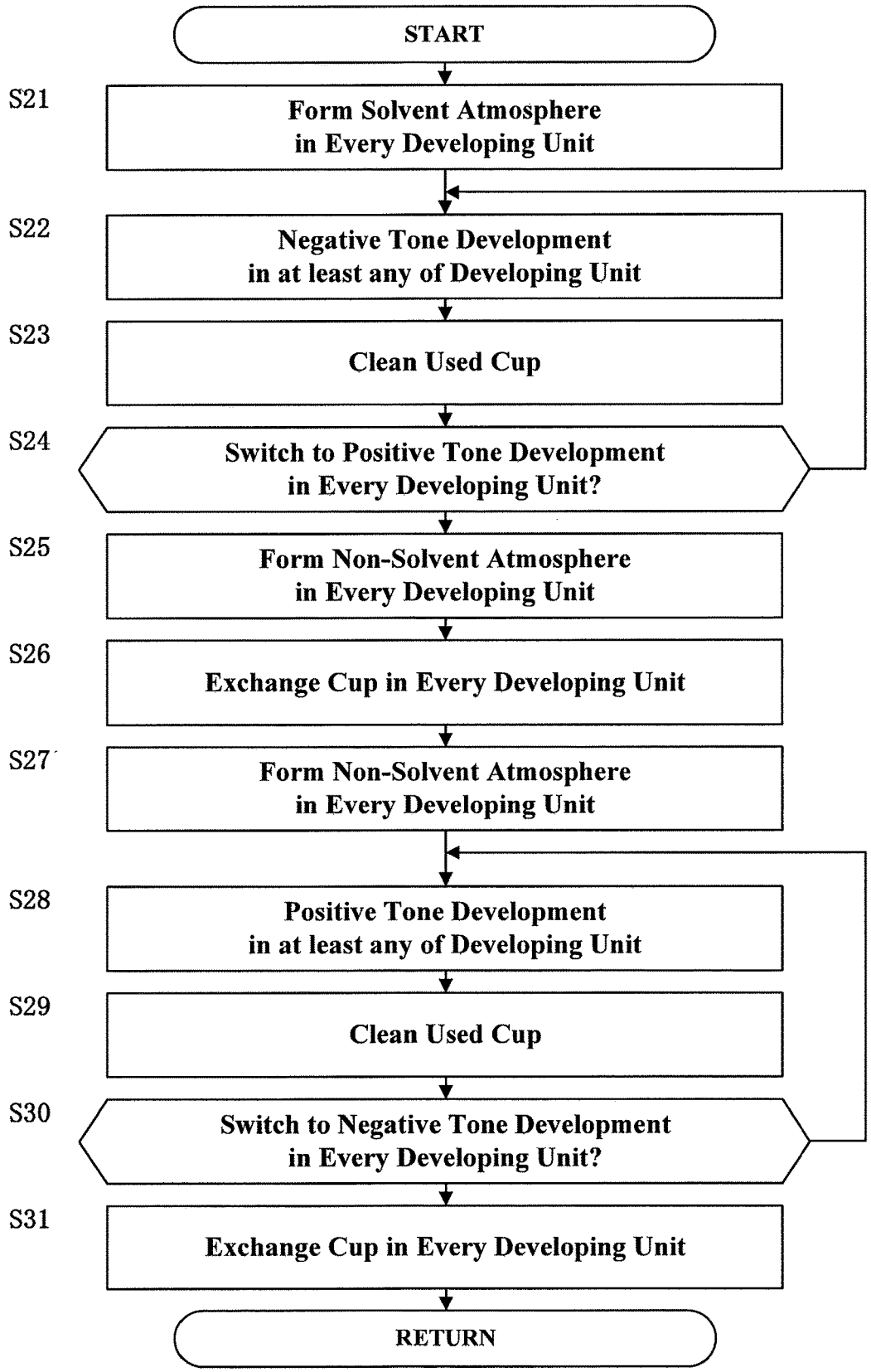
FIG. 12 is a flow chart of operation of a plurality of developing units in the same space.

The following describes one non-limiting example of operation of the developing units 77A and 77B. FIG. 12 is a flow chart of operation of the developing units 77A and 77B. The example of the operation has a characteristic that the developing units 77A and 77B cooperatively perform switching between the positive tone development and the negative tone development as well as formation of various atmospheres. Hereinunder, the operation common to that in Preferred Embodiment 1 is to be described appropriately in a simple manner.

<Step S21> Form Solvent Atmosphere with Every Developing Unit

The developing units 77A and 77B each form a solvent atmosphere. The solvent atmosphere is formed in the same manner as in the step S1 of Preferred Embodiment 1 by spraying the cleaning liquid for negative tone development to the exterior cup 31. Accordingly, the solvent atmosphere is formed to every exterior cup 31 in the developing units 77A and 77B.

<Step S22> Negative Tone Development in at Least any of Developing Units

The main transport mechanism T2 transports the substrate W into the developing units 77A and 77B. The developing units 77A and 77B perform negative tone development to the transported substrate W. When the negative tone development is completed, the main transport mechanism T2 transports the substrate W from the developing units 77A and 77B.

As noted above, in this step S22, at least either the developing unit 77A or 77B performs the negative tone development to the substrate W. For instance, the developing units 77A and 77B may perform the negative tone development in parallel. Alternatively, only the developing unit 77A may perform the negative tone development. Note that the process performable in the step S22 is limited to the negative tone development, and thus the positive tone development by any of the developing units 77A and 77B is prohibited.

<Step S23> Clean Used Cup

The exterior, cup 31 of the developing unit 77A is cleaned every time the developing unit 77A performs the negative tone development. Similarly, the exterior cup 31 of the developing unit 77B is cleaned every time the developing unit 77B performs the negative tone development.

<Step S24> Switch to Positive Tone Development in Every Developing Unit?

The process proceeds to step S25 if both the developing units 77A and 77B perform switching to the positive tone development. Otherwise, the process returns to the step S22.

<Step S25> Form Non-Solvent Atmosphere with Every Developing Unit

Both the developing units 77A and 77B form the non-solvent atmosphere. The solvent atmosphere is formed in the same manner as in the step S5 of Preferred Embodiment 1 by spraying the cleaning liquid for positive tone development to the exterior cup 31. Accordingly, a non-solvent atmosphere is formed in every exterior cup 31 in the developing units 77A and 77B.

<Step S26> Exchange Cup in Every Developing Unit

All the exterior cups 31 remain at the cleaning position. All the interior cups 21 are each moved to the collecting position while the exterior cups 31 are each in the cleaning position.

<Step S27> Form Non-Solvent Atmosphere in Every Developing Unit

Both the developing units 77A and 77B each form the non-solvent atmosphere. The non-solvent atmosphere is formed in the same manner as in the step S7 of Preferred Embodiment 1 by spraying the cleaning liquid for positive tone development to the interior cup 21. Accordingly, the non-solvent atmosphere is formed in every interior cup 21.

<Step S28> Positive Tone Development in at Least any of Developing Units

Then, at least any of the developing units 77A and 77B performs the positive tone development to the substrate W. The process performable in the step S28 is limited to the positive tone development, and thus the negative tone development by any of the developing units 77A and 77B is prohibited.

<Step S29> Clean Used Cup

The used interior cup 21 is cleaned every positive tone development by the developing units 77A and 77b, respectively.

<Step S30> Switch to Negative Tone Development in Every Developing Unit?

The process proceeds to step S31 if both the developing units 77A and 77B perform switching to the negative tone development. Otherwise, the process returns to the step S28.

<Step S31> Exchange Cup

All the exterior cups 31 are each moved to the cleaning position. All the interior cups 21 are each moved to the retracting position while the exterior cups 31 are each in the cleaning position.

The step S21 mentioned above corresponds to the "first pre-spraying step of spraying in advance a cleaning liquid for negative tone development to each of the second cup" in the present invention, and the "solvent atmosphere pre-forming step" in the present invention. The step S22 is one non-limiting example of the "negative tone developing step" in the present invention. The steps S25 and S27 are one non-limiting example of the "non-solvent atmosphere pre-forming step" in the present invention. Moreover, the step S25 corresponds to the "spraying step of spraying the cleaning liquid for positive tone development to each of the second cups" in the present invention. The step S27 is one non-limiting example of the "second pre-spraying step of spraying in advance a cleaning liquid for positive tone development to each of the first cups" in the present invention.

<Effect>

The present embodiment 2 produces the following effect in addition to that with Preferred Embodiment 1.

The developing units 77A and 77B within the chamber 78 perform collective switching between the negative tone development and the positive tone development (steps S24, S30). Consequently, this prevents any of the developing units 77A and 77B from inhibiting the atmosphere of the other of the developing unit 77A or 77B.

Both of the developing units 77A and 77B form the solvent atmosphere upon switching to the negative tone development (step S21). This allows rapid formation of the solvent atmosphere. Moreover, any of the developing units 77A and 77B allows high-quality negative tone development from the beginning.

Both of the developing units 77A and 77B form the non-solvent atmosphere upon switching to the positive tone development (steps S25 and S27). This allows rapid formation of the non-solvent atmosphere. Moreover, any of the developing units 77A and 77B allows high-quality positive tone development from the beginning.

The present invention is not limited to the foregoing examples, but may be modified as follows.

(1) In each of the embodiments mentioned above, the treatment with the interior cup 21 corresponds to the positive tone development, and the treatment with the exterior cup 31 corresponds to the negative tone development. However, this is not limitative. For instance, the treatment with the interior cup 21 may be the negative tone development. Alternatively, the treatment with the interior cup 21 may be a liquid treatment such as cleaning or coating. Similarly, the treatment with the exterior cup 31 may be the positive tone development. Alternatively, the treatment with the exterior cup 31 may be a liquid treatment such as cleaning or coating. Such modification achieves various types of liquid treatments to the substrate W selectively. Moreover, in the present embodiments, the apparatus performs either the treatment with the interior cup 21 (positive tone development) or the process with the exterior cup 31 (negative tone development) to one substrate W. However, this is not limitative. That is, the apparatus may be modified to an apparatus that performs both the treatment with the interior cup 21 and the exterior cup 31 to one substrate W.

Figure 13:
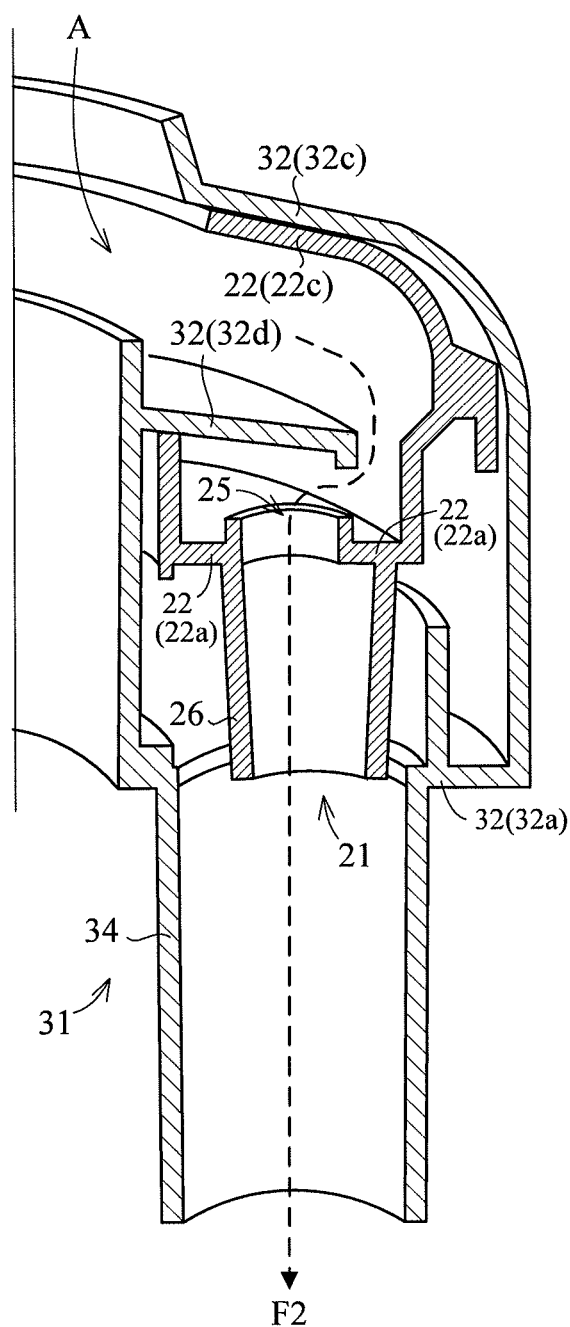
FIG. 13 is a schematic sectional view of cups according to a preferred modification of the present invention.

(2) In the embodiments mentioned above, the hood 27 is used for preventing the treatment liquid from flowing into the exhaust port 25. However, this is not limitative. FIG. 13 illustrates an exhaust configuration of an interior cup 21 according to one modification of the present invention. Here, the exhaust port 25 is disposed higher in level than the drain outlet 23. Such a modification' prevents the treatment liquid from flowing into the exhaust port 25.

(3) The embodiments mentioned above include the interior cup lifting mechanism 41A exclusively moving the interior cup 21 vertically and the exterior cup lifting mechanism 41B exclusively moving the exterior cup 31 vertically as one example of the cup lifting mechanism 41. However, this is not limitative.

For instance, the cup lifting mechanism 41 may include an entire lifting mechanism that moves the interior cup 21, the interior cup lifting mechanism 41A, and the exterior cup 31 integrally. This allows movement of the exterior cup 31 to the treatment position and the cleaning position while the interior cup 21 is kept in the collecting position or the retracting position only by operation of the entire lifting mechanism. In other words, only the operation of the entire lifting mechanism allows movement of the exterior cup 31 to the treatment position and the cleaning position without changing a relative position between the interior cup 21 and the exterior cup 31.

For instance, when the substrate treating apparatus 1 includes a mechanism that moves the substrate holder 5 and the spray disk 16 vertically, the exterior cup lifting mechanism 41B may be omitted and the exterior cup 31 may be fixed.

(4) In the embodiments mentioned above, the non-solvent atmosphere is formed in the exterior cup 31 prior to the positive tone developing step (steps S5, S25). However, this is not limitative. That is, the steps S5 and S25 may be omitted. Such a modification allows formation of the non-solvent atmosphere prior to the positive tone development.

(5) In the embodiments mentioned above, the nozzles 14A and 14B perform discharge to the openings 17A and 17B, respectively. However, this is not limitative. For instance, the nozzles 14A and 14B may perform discharge to the same opening. Such a modification allows formation of the solvent atmosphere and the non-solvent atmosphere within the spray disk 16. In addition, in this modification, either a flow path in fluid communication with the opening 17A or a flow path in fluid communication with the opening 17B may be omitted.

(6) In the embodiments mentioned above, the cleaning liquid for negative tone development is used for forming the solvent atmosphere. However, this is not limitative. For instance, the solvent atmosphere may be formed with a liquid or gas containing an organic solvent. Similarly, in the embodiments mentioned above, the cleaning liquid for positive tone development is used for forming the non-solvent atmosphere. However, this is not limitative. The non-solvent atmosphere may be formed with a liquid or gas that allows removal of the organic solvent containing in the atmosphere.

(7) With the embodiments mentioned above, the cup cleaner 13 forms the atmosphere. However, this is not limitative. For instance, the substrate treating apparatus 1 and the developing units 77A and 77B may include a spraying unit. The spraying unit is disposed separately from the cup cleaner 13, and sprays at least either liquid or gas. Such a modification allows the spray unit to form the atmosphere suitably.

(8) The present embodiments and the modifications in the above (1) to (7) may be variable appropriately by replacing or combining the unit of the present embodiments or the modifications with the other thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus that performs treatment to a substrate, the substrate treating apparatus comprising:

a substrate holder that holds the substrate in a substantially horizontal attitude;
a rotating drive unit that rotates the substrate holder around a substantially vertical axis;
a treatment liquid supplying unit that supplies a treatment liquid to the substrate held on the substrate holder;
an exterior cup that surrounds the substrate holder laterally; and
an interior cup accommodated in the exterior cup,
the interior cup being movable between a collection position in which the interior cup collects the treatment liquid and a retracting position in which the exterior cup collects the treatment liquid, and further comprising:
  an interior cup main body with an annular contour;
  a liquid outlet formed in the interior cup main body for draining the treatment liquid in the interior cup main body;
  an exhaust port formed in the interior cup main body for exhausting gas in the interior cup main body; and
  a collar that is connected to the interior cup main body, and
the exterior cup further comprising:
  an exterior cup main body with an annular contour;
  a liquid outlet formed in the exterior cup main body for draining the treatment liquid in the exterior cup main body;
  an exhaust port formed in the exterior cup main body for exhausting gas in the exterior cup main body; and
  a partition wall that partitions the liquid outlet of the exterior cup and the exhaust port of the exterior cup,
  the exhaust port of the exterior cup is disposed inwardly from the partition wall,
  the liquid outlet of the exterior cup is disposed outwardly from the partition wall, and
  the collar guides the treatment liquid outwardly from the partition wall when the interior cup is disposed in the retracting position.

2. The substrate treating apparatus according to claim 1, wherein
the interior cup further comprises a cover that covers an upper side of the exhaust port of the interior cup.

3. The substrate treating apparatus according to claim 1, wherein
the exhaust port of the interior cup is disposed higher in level than the liquid outlet of the interior cup.

4. The substrate treating apparatus according to claim 1, wherein
the interior cup main body covers an upper side of the exhaust port of the exterior cup.

5. A substrate treating apparatus that performs treatment to a substrate, the substrate treating apparatus comprising:
a substrate holder that holds the substrate in a substantially horizontal attitude;
a rotating drive unit that rotates the substrate holder around a substantially vertical axis;
a treatment liquid supplying unit that supplies a treatment liquid to the substrate held on the substrate holder;
an exterior cup that surrounds the substrate holder laterally; and
an interior cup accommodated in the exterior cup,
the interior cup being movable between a collection position in which the interior cup collects the treatment liquid and a retracting position in which the exterior cup collects the treatment liquid, and further comprising:
  an interior cup main body with an annular contour;
  a liquid outlet formed in the interior cup main body for draining the treatment liquid in the interior cup main body;
  an exhaust port formed in the interior cup main body for exhausting gas in the interior cup main body; and
  a drain tube that is connected to the interior cup main body for passing the treatment liquid drained from the liquid outlet of the interior cup, and
the exterior cup further comprising:
  an exterior cup main body with an annular contour;
  a liquid outlet formed in the exterior cup main body for draining the treatment liquid in the exterior cup main body;
  an exhaust port formed in the exterior cup main body for exhausting gas in the exterior cup main body; and
  an extension drain tube that is connected to the exterior cup main body for accommodating a lower end of the drain tube of the interior cup, and for passing the treatment liquid drained from the drain tube of the interior cup.

6. The substrate treating apparatus according to claim 5, wherein
the interior cup further comprises a cover that covers an upper side of the exhaust port of the interior cup.

7. The substrate treating apparatus according to claim 5, wherein
the exhaust port of the interior cup is disposed higher in level than the liquid outlet of the interior cup.

8. The substrate treating apparatus according to claim 5, wherein
the interior cup main body covers an upper side of the exhaust port of the exterior cup.

9. The substrate treating apparatus according to claim 5, wherein
the extension drain tube accommodates the drain tube of the interior cup such that the drain tube is movable vertically.

10. The substrate treating apparatus according to claim 5, wherein
a part of the drain tube of the interior cup inserted into the extension drain tube has a length of 80 mm or less when the interior cup is in the collection position.

11. A substrate treating apparatus that performs treatment to a substrate, the substrate treating apparatus comprising:
a substrate holder that holds the substrate in a substantially horizontal attitude;
a rotating drive unit that rotates the substrate holder around a substantially vertical axis;
a treatment liquid supplying unit that supplies a treatment liquid to the substrate held on the substrate holder;
an exterior cup that surrounds the substrate holder laterally; and
an interior cup accommodated in the exterior cup,
the interior cup being movable between a collection position in which the interior cup collects the treatment liquid and a retracting position in which the exterior cup collects the treatment liquid, and further comprising:
  an interior cup main body with an annular contour;
  a liquid outlet formed in the interior cup main body for draining the treatment liquid in the interior cup main body;
  an exhaust port formed in the interior cup main body for exhausting gas in the interior cup main body; and
  an exhaust tube that is connected to the interior cup main body for passing the gas exhausted from the exhaust port of the interior cup main body, and the exterior cup further comprising:
- an exterior cup main body with an annular contour;
- a liquid outlet formed in the exterior cup main body for draining the treatment liquid in the exterior cup main body;
- an exhaust port formed in the exterior cup main body for exhausting gas in the exterior cup main body; and
- an extension exhaust tube that is connected to the exterior cup main body for accommodating a lower end of the exhaust tube of the interior cup, and for passing the gas exhausted from the exhaust tube of the interior cup.

12. The substrate treating apparatus according to claim 11, wherein
the interior cup further comprises a cover that covers an upper side of the exhaust port of the interior cup.

13. The substrate treating apparatus according to claim 11, wherein
the exhaust port of the interior cup is disposed higher in level than the liquid outlet of the interior cup.

14. The substrate treating apparatus according to claim 11, wherein
the interior cup main body covers an upper side of the exhaust port of the exterior cup.

15. The substrate treating apparatus according to claim 11, wherein
the extension exhaust tube accommodates the exhaust tube of the interior cup such that the exhaust tube is movable vertically.

16. The substrate treating apparatus according to claim 11, wherein
a part of the exhaust tube of the interior cup inserted into the extension exhaust tube has a length of 80 mm or less when the interior cup is in the collection position.

17. A substrate treating apparatus that performs treatment to a substrate, the substrate treating apparatus comprising:
- a substrate holder that holds the substrate in a substantially horizontal attitude;
- a rotating drive unit that rotates the substrate holder around a substantially vertical axis;
- a treatment liquid supplying unit that supplies a treatment liquid to the substrate held on the substrate holder;
- an exterior cup that surrounds the substrate holder laterally; and
- an interior cup accommodated in the exterior cup, the interior cup being movable between a collection position in which the interior cup collects the treatment liquid and a retracting position in which the exterior cup collects the treatment liquid, and further comprising:
- an interior cup main body with an annular contour;
- a liquid outlet formed in the interior cup main body for draining the treatment liquid in the interior cup main body; and
- an exhaust port formed in the interior cup main body for exhausting gas in the interior cup main body, and the exterior cup further comprising:
- an exterior cup main body with an annular contour;
- a liquid outlet formed in the exterior cup main body for draining the treatment liquid in the exterior cup main body; and
- an exhaust port formed in the exterior cup main body for exhausting gas in the exterior cup main body, the substrate treating apparatus further comprising:
- a cleaning liquid supplying unit that supplies cleaning liquids for cleaning the interior cup and the exterior cup; and
- a spray disk that is rotatable and sprays the cleaning liquids supplied from the cleaning liquid supplying unit to the interior cup and the exterior cup, wherein the cleaning liquid supplying unit comprises
- a first nozzle that dispenses a first cleaning liquid of the cleaning liquids to the spray disk; and
- a second nozzle that dispenses a second cleaning liquid of the cleaning liquids, different from the first cleaning liquid from the first nozzle, to the spray disk.

18. The substrate treating apparatus according to claim 17, wherein
the interior cup further comprises a cover that covers an upper side of the exhaust port of the interior cup.

19. The substrate treating apparatus according to claim 17, wherein
the exhaust port of the interior cup is disposed higher in level than the liquid outlet of the interior cup.

20. The substrate treating apparatus according to claim 17, wherein
the interior cup main body covers an upper side of the exhaust port of the exterior cup.

* * * * *